US007198877B2

(12) United States Patent
Van Damme et al.

(10) Patent No.: US 7,198,877 B2
(45) **Date of Patent: *Apr. 3, 2007**

(54) HEAT-SENSITIVE LITHOGRAPHIC PRINTING PLATE PRECURSOR

(75) Inventors: Marc Van Damme, Bonheiden (BE); Johan Loccufier, Zwijnaarde (BE); Bert Groenendaal, Sinaai (BE); Huub Van Aert, Pulderbos (BE)

(73) Assignee: Agfa-Gevaert, Mortsel (BE)

( * ) Notice: Subject to any disclaimer, the term of this patent is extended or adjusted under 35 U.S.C. 154(b) by 0 days.

This patent is subject to a terminal disclaimer.

(21) Appl. No.: 10/531,627

(22) PCT Filed: Sep. 29, 2003

(86) PCT No.: PCT/EP03/50664

§ 371 (c)(1), (2), (4) Date: Jul. 1, 2005

(87) PCT Pub. No.: WO2004/035310

PCT Pub. Date: Apr. 29, 2004

(65) Prior Publication Data

US 2006/0019190 A1 Jan. 26, 2006

Related U.S. Application Data

(60) Provisional application No. 60/423,674, filed on Nov. 4, 2002.

(30) Foreign Application Priority Data

Oct. 15, 2002 (EP) .................................. 02102446

(51) Int. Cl.
*G03F 7/11* (2006.01)
*G03F 7/30* (2006.01)

(52) U.S. Cl. .................. 430/166; 430/190; 430/270.1; 430/302; 430/944

(58) Field of Classification Search ............. 430/270.1, 430/302, 944, 166, 190
See application file for complete search history.

(56) References Cited

U.S. PATENT DOCUMENTS

| | | | |
|---|---|---|---|
| 3,929,488 | A | 12/1975 | Smith |
| 3,971,660 | A | 7/1976 | Staehle |
| 4,045,232 | A | 8/1977 | Parkinson |
| 4,115,128 | A | 9/1978 | Kita |
| 4,284,705 | A | 8/1981 | Philpot et al. |
| 4,458,005 | A | 7/1984 | Mohr et al. |
| 4,840,713 | A | 6/1989 | Pliefke |
| 4,897,168 | A | 1/1990 | Boergerding et al. |
| 4,981,517 | A | 1/1991 | DeSanto, Jr. et al. |
| 5,156,723 | A | 10/1992 | Pliefke et al. |
| 5,163,368 | A | 11/1992 | Pensavecchia et al. |
| 5,174,205 | A | 12/1992 | Kline et al. |
| 5,229,253 | A | 7/1993 | Zertani et al. |
| 5,314,787 | A | 5/1994 | Elsaesser et al. |
| 5,556,531 | A | 9/1996 | Wiedemann |
| 5,637,441 | A | 6/1997 | Brenk et al. |
| 5,695,903 | A | 12/1997 | Elsaesser et al. |
| 6,140,392 | A | 10/2000 | Kingman et al. |
| 6,190,825 | B1 | 2/2001 | Denzinger et al. |
| 6,200,727 | B1 | 3/2001 | Urano et al. |
| 6,890,626 | B1 | 5/2005 | Itatani |

FOREIGN PATENT DOCUMENTS

| | | | |
|---|---|---|---|
| DE | 40 01 466 | A1 | 7/1991 |
| DE | 40 07 428 | A1 | 9/1991 |
| DE | 40 27 301 | A1 | 3/1992 |
| DE | 44 17 907 | A1 | 11/1995 |
| DE | 44 23 104 | A1 | 1/1996 |
| DE | 44 45 820 | A1 | 6/1996 |
| EP | 0 291 760 | | 11/1988 |
| EP | 0 292 801 | | 11/1988 |
| EP | 0 537 633 | A1 | 4/1993 |
| EP | 0 601 240 | A1 | 6/1994 |
| EP | 0 619 524 | A1 | 10/1994 |
| EP | 0 619 525 | A1 | 10/1994 |
| EP | 0 620 502 | A1 | 10/1994 |
| EP | 0 659 909 | A1 | 6/1995 |
| EP | 0 823 327 | A2 | 2/1998 |
| EP | 0 934 822 | | 8/1999 |
| EP | 1 072 432 | A2 | 1/2001 |
| FR | 2 300 354 | | 9/1976 |
| GB | 1 084 070 | | 9/1967 |
| GB | 1 419 512 | | 12/1975 |
| JP | 20-96755 | | 4/1990 |
| JP | 60-88942 | A1 | 3/1994 |
| WO | WO 97/39894 | A1 | 10/1997 |
| WO | WO 00/32705 | A1 | 6/2000 |

OTHER PUBLICATIONS

International Search Report for PCT/EP03/50664.
*J. Colloid and Interface Sci.*; vol. 26; pp. 62-69 (1968).

*Primary Examiner*—John S. Chu
(74) *Attorney, Agent, or Firm*—Leydig, Voit & Mayer, Ltd.

(57) ABSTRACT

A heat-sensitive lithographic printing plate precursor is disclosed which comprises a hydrophilic support and an oleophilic coating comprising an infrared absorbing agent and a polymer, which comprises a phenolic monomeric unit wherein the phenyl group of the phenolic monomeric unit is substituted by a group having the structure —N═N-Q wherein the —N═N— group is covalently bound to a carbon atom of the phenyl group and wherein Q is an aromatic group and wherein the substitution increases the chemical resistance of the coating.

58 Claims, No Drawings

HEAT-SENSITIVE LITHOGRAPHIC PRINTING PLATE PRECURSOR

FIELD OF THE INVENTION

The present invention relates to a heat-sensitive lithographic printing plate precursor.

BACKGROUND OF THE INVENTION

Lithographic printing presses use a so-called printing master such as a printing plate which is mounted on a cylinder of the printing press. The master carries a lithographic image on its surface and a print is obtained by applying ink to said image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-abhesive (ink-repelling) areas and during driographic printing, only ink is supplied to the master.

Printing masters are generally obtained by the so-called computer-to-film method wherein various pre-press steps such as typeface selection, scanning, color separation, screening, trapping, layout and imposition are accomplished digitally and each color selection is transferred to graphic arts film using an image-setter. After processing, the film can be used as a mask for the exposure of an imaging material called plate precursor and after plate processing, a printing plate is obtained which can be used as a master.

A typical printing plate precursor for computer-to-film methods comprise a hydrophilic support and an image-recording layer of a photosensitive polymer layers which include UV-sensitive diazo compounds, dichromate-sensitized hydrophilic colloids and a large variety of synthetic photopolymers. Particularly diazo-sensitized systems are widely used. Upon image-wise exposure, typically by means of a film mask in a UV contact frame, the exposed image areas become insoluble and the unexposed areas remain soluble in an aqueous alkaline developer. The plate is then processed with the developer to remove the diazonium salt or diazo resin in the unexposed areas. So the exposed areas define the image areas (printing areas) of the printing master, and such printing plate precursors are therefore called 'negative-working'. Also positive-working materials, wherein the exposed areas define the non-printing areas, are known, e.g. plates having a novolac/naphtoquinone-diazide coating which dissolves in the developer only at exposed areas.

In addition to the above photosensitive materials, also heat-sensitive printing plate precursors have become very popular. Such thermal materials offer the advantage of daylight-stability and are especially used in the so-called computer-to-plate method wherein the plate precursor is directly exposed, i.e. without the use of a film mask. The material is exposed to heat or to infrared light and the generated heat triggers a (physico-)chemical process, such as ablation, polymerization, insolubilisation by cross-linking of a polymer, heat-induced solubilisation, decomposition, or particle coagulation of a thermoplastic polymer latex.

The known heat-sensitive printing plate precursors typically comprise a hydrophilic support and a coating containing an oleophilic polymer, which is alkali-soluble in exposed areas (positive working material) or in non-exposed areas (negative working material) and an IR-absorbing compound. Such an oleophilic polymer is typically a phenolic resin.

WO99/01795 describes a method for preparing a positive working resist pattern on a substrate wherein the coating composition comprises a polymeric substance having functional groups such that the functionalised polymeric substance has the property that it is developer insoluble prior to delivery of radiation and developer soluble thereafter. Suitable functional groups are known to favor hydrogen bonding and may comprise amino, amido, chloro, fluoro, carbonyl, sulphinyl and sulphonyl groups and these groups are bonded to the polymeric substance by an esterification reaction with the phenolic hydroxy group to form a resin ester.

EP-A 0 934 822 describes a photosensitive composition for a lithographic printing plate wherein the composition contains an alkali-soluble resin having phenolic hydroxyl groups and of which at least some of the phenolic hydroxyl groups are esterified by a sulphonic acid or a carboxylic acid compound.

EP-A 1 072 432 describes an image forming material which comprises a recording layer which is formed of a composition whose solubility in water or in an alkali aqueous solution is altered by the effects of light or heat. This recording layer comprises a polymer of vinyl phenol or a phenolic polymer, wherein hydroxy groups and alkoxy groups are directly linked to the aromatic hydrocarbon ring. The alkoxy group is composed of 20 or less carbon atoms.

U.S. Pat. No. 3,929,488 describes a light sensitive positive-working printing plate comprising an azo-dye which is a novolac resin, bearing diazophenyl chromophoric moiety on the phenolic ring, and which undergoes a color change in the presence of the light decomposition product of a diazonium salt. This color change is caused by a protonation of the azo-dye nitrogens by the acid produced by the diazonium salt on exposure to light. This azo-dye is used as an indicator dye which allows to inspect the light-struck areas on the plate. In comparison with conventional indicator dyes, this azo-dye has an increased solubility in the developer solution and, consequently, is not left behind after development on the plate. As a result, there is no risk of remaining dye, which can cause staining on the non-image areas or scumming during the printing process. The most favored azo-dye as indicator dye in these light-sensitive compositions which can undergo such a strong color change in the visible light range by protonation, is an azo-dye, derived of an azoic coupling of diphenylamine-4-diazonium fluoroborate with novolac.

The ink and fountain solution which are supplied to the plate during the printing process, may attack the coating and, consequently, the resistance of the coating against these liquids, hereinafter referred to as "chemical resistance", may affect the printing run length. The most widely used polymers in these coatings are phenolic resins and it has been found in the above prior art that the printing run length can be improved by modifying such resins by a chemical substitution reaction on the hydroxyl group of the phenolic group. However, this modification reaction decreases the number of free hydroxyl groups on the polymer and thereby reduces the solubility of the coating in an alkaline developer. The modification reaction proposed in the present invention enables to increase the chemical resistance of the coating without substantially reducing the developability of the coating.

SUMMARY OF THE INVENTION

It is an aspect of the present invention to provide a heat-sensitive lithographic printing plate precursor comprising a heat-sensitive coating with improved chemical resistance of the coating against printing liquids and press chemicals. This object is realized by the precursor as defined in claim 1, having the characteristic feature that the heat-sensitive coating of the precursor comprises a polymer which comprises a phenolic monomeric unit wherein the phenyl group of the phenolic monomeric unit is substituted by a group having the structure —N═N-Q wherein the —N═N— group is covalently bound to a carbon atom of the phenyl group and wherein Q is an aromatic group.

Specific embodiments of the invention are defined in the dependent claims.

DETAILED DESCRIPTION OF THE INVENTION

In order to obtain a heat-sensitive lithographic printing plate with an improved printing run length, it is important to increase the chemical resistance of the heat-sensitive coating against the printing liquids such as the dampening liquid and ink, and against the press chemicals such as cleaning liquids for the plate, for the blanket and for the press rollers. These printing properties are affected by the composition of the coating wherein the type of polymer is one of the most important components for this property.

In accordance with the present invention, there is provided a heat-sensitive lithographic printing plate precursor comprising a support having a hydrophilic surface and an oleophilic coating, said coating comprising an infrared light absorbing agent and a polymer, which comprises a phenolic monomeric unit wherein the phenyl group of the phenolic monomeric unit is substituted by a group having the structure —N═N-Q, wherein the —N═N— group is covalently bound to a carbon atom of the phenyl group and wherein Q is an aromatic group, herein after also referred to as an "azo-aryl group".

It is also an aspect of the present invention that the oleophilic coating comprising this polymer has an increased chemical resistance due to the modification of the polymer by this specified substituting group having the structure —N═N-Q, wherein the —N═N— group is covalently bound to a carbon atom of the phenyl group and wherein Q is an aromatic group. This chemical resistance can be measured by several tests.

A suitable method for quantifying the chemical resistance is described as Test 4 in the examples. A preferred precursor in accordance with the present invention is characterized by a weight loss of the coating lower than 45%, calculated as described in the mentioned Test 4, more preferably lower than 35%, and most preferably lower than 20%.

In accordance with the present invention, the substituent Q of the polymer, comprising a phenolic monomeric unit substituted as described above, is an aromatic group which may comprise at least one heteroatom selected from nitrogen, oxygen or sulfur, preferentially nitrogen or sulfur atom. Said heteroatom can be part of the aromatic ring and/or may be present in a substituent attached to said ring.

In accordance with the present invention, the substituent Q may have the structure A-$(T)_n$. In this structure A represents a mono-cyclic 5- or 6-membered aromatic group or a 5- or 6-membered aromatic ring annelated with another ring system. Annelated means that two ring systems have two vicinal carbon atoms in common. In this structure n is an integer, selected between 0 and the maximum available positions on the aromatic group A, and each T group is selected from —$SO_2$—NH—$R^1$, —NH—$SO_2$—$R^4$, —CO—$NR^1$—$R^2$, —$NR^1$—CO—$R^4$, —$NR^1$—CO—$NR^2$—$R^3$, —$NR^1$—CS—$NR^2$—$R^3$, —$NR^1$—CO—O—$R^1$, —O—CO—$NR^1$—$R^2$, —O—CO—$R^4$, —CO—O—$R^2$, —CO—$R^3$, —$SO_3$—$R^1$, —O—$SO_2$—$R^4$, —$SO_2$—$R^1$, —SO—$R^4$, —P(═O) (—O—$R^1$) (—O—$R^2$), —O—P(═O) (—O—$R^1$)(—O—$R^2$), —$NR^1$—$R^2$, —O—$R^2$, —S—$R^2$, —N═N—$R^4$, —CN, —$NO_2$, a halogenide or -M-$R^1$, wherein M represents a divalent linking group containing 1 to 8 carbon atoms, wherein $R^1$, $R^2$ and $R^3$ are each independently selected from hydrogen or an optionally substituted alkyl, alkenyl, alkynyl, cycloalkyl, heterocyclic, aryl, heteroaryl, aralkyl or heteroaralkyl group, wherein $R^4$ and $R^5$ are selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^5$ together represent the necessary atoms to form a cyclic structure.

In accordance with the present invention, the substitutent —N═N-Q may comprise the following formula

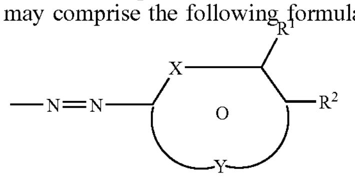

wherein X is $CR^3$, $NR^4$ or N, wherein Y denotes the necessary atoms to form a 5- or 6-membered aromatic ring, said atoms being selected from the group consisting of $CR^3$, $NR^4$, N, S or O, wherein each $R^1$, $R^2$ and $R^3$ is selected from hydrogen, an optionally substituted alkyl, alkenyl, alkynyl, cycloalkyl, heterocyclic, aryl, heteroaryl, aralkyl or heteroaralkyl group, —$SO_2$—NH—$R^5$, —NH—$SO_2$—$R^7$, —CO—$NR^5$—$R^6$, —$NR^5$—CO—$R^7$, —O—CO—$R^7$, —CO—O—$R^5$, —CO—$R^5$, —$SO_3$—$R^5$, —$SO_2$—$R^5$, —SO—$R^7$, —P(═O)(—O—$R^5$)(—O—$R^6$), —$NR^5$—$R^6$, —O—$R^5$, —S—$R^5$, —CN, —$NO_2$, halogen or -M-$R^5$, wherein M represents a divalent linking group containing 1 to 8 carbon atoms, wherein $R^4$, $R^5$ and $R^6$ are independently selected from hydrogen or an optionally substituted alkyl, alkenyl, alkynyl, cycloalkyl, heterocyclic, aryl, heteroaryl, aralkyl or heteroaralkyl group, wherein $R^7$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^7$ together represent the necessary atoms to form a cyclic structure.

In accordance with the present invention, the substituting group —N═N-Q may comprise the following formula

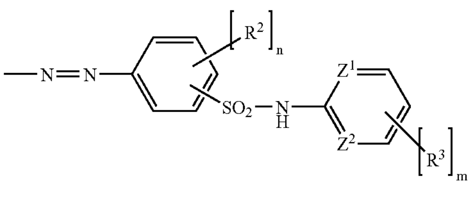

wherein $Z^1$ and $Z^2$ are independently selected from $CR^1$ or N, wherein $R^1$ is selected from hydrogen or an optionally substituted alkyl, alkenyl, alkynyl, cycloalkyl, heterocyclic, aryl, heteroaryl, aralkyl or heteroaralkyl group, wherein n is 0, 1, 2, 3 or 4, wherein m is 0, 1, 2 or 3, wherein $R^2$ and $R^3$ are independently selected from hydrogen, an optionally substituted alkyl, alkenyl, alkynyl, cycloalkyl, heterocyclic, aryl, heteroaryl, aralkyl or heteroaralkyl group, $—SO_2—NH—R^4$, $—NH—SO_2—R^6$, $—CO—NR^4—R^5$, $—NR^4—CO—R^6$, $—O—CO—R^6$, $CO—O—R^4$, $—CO—R^4$, $—SO_3—R^4$, $—SO_2—R^4$, $—SO—R^6$, $—P(=O)(—O—R^4)(—O—R^5)$, $—NR^4—R^5$, $—O—R^4$, $—S—R^4$, —CN, $—NO_2$, halogen or $-M-R^4$, wherein M represents a divalent linking group containing 1 to 8 carbon atoms, wherein $R^4$ and $R^5$ are independently selected from hydrogen or an optionally substituted alkyl, alkenyl, alkynyl, cycloalkyl, heterocyclic, aryl, heteroaryl, aralkyl or heteroaralkyl group, wherein $R^6$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^6$ together represent the necessary atoms to form a cyclic structure.

In accordance with the present invention, the substituting group —N=N-Q may comprise the following formula

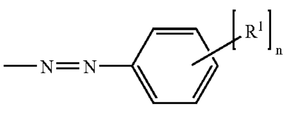

wherein n is 0, 1, 2, 3, 4 or 5, wherein each $R^1$ is selected from hydrogen, an optionally substituted alkyl, alkenyl, alkynyl, cycloalkyl, heterocyclic, aryl, heteroaryl, aralkyl or heteroaralkyl group, $—SO_2—NH—R^2$, $—NH—SO_2—R^4$, $—CO—NR^2—R^3$, $—NR^2—CO—R^4$, $—O—CO—R^4$, $—CO—O—R^2$, $—CO—R^2$, $—SO_3—R^2$, $—SO_2—R^2$, $—SO—R^4$, $—P(=O)(—O—R^2)(—O—R^3)$, $—NR^2—R^3$, $—O—R^2$, $—S—R^2$, —CN, $—NO_2$, a halogen or $-M-R^2$, wherein M represents a divalent linking group containing 1 to 8 carbon atoms, wherein $R^2$ and $R^3$ are independently selected from hydrogen or an optionally substituted alkyl, alkenyl, alkynyl, cycloalkyl, heterocyclic, aryl, heteroaryl, aralkyl or heteroaralkyl group, wherein $R^4$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^4$ together represent the necessary atoms to form a cyclic structure.

In accordance with the present invention, the substituting group —N=N-Q may comprise the following formula

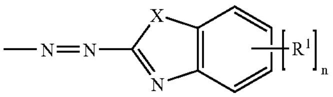

wherein n is 0, 1, 2, 3 or 4, wherein each $R^1$ is selected from hydrogen, an optionally substituted alkyl, alkenyl, alkynyl, cycloalkyl, heterocyclic, aryl, heteroaryl, aralkyl or heteroaralkyl group, $—SO_2—NH—R^2$, $—NH—SO_2—R^4$, $—CO—NR^2—R^3$, $—NR^2—CO—R^4$, $—O—CO—R^4$, $—CO—O—R^2$, $—CO—R^2$, $—SO_3—R^2$, $—SO_2—R^2$, $—SO—R^4$, $—P(=O)(—O—R^2)(—O—R^3)$, $—NR^2—R^3$, $—O—R^2$, $—S—R^2$, —CN, $—NO_2$, a halogen or-M-$R^2$, wherein M represents a divalent linking group containing 1 to 8 carbon atoms, wherein X is O, S or $NR^5$, wherein $R^2$, $R^3$ and $R^5$ are independently selected from hydrogen or an optionally substituted alkyl, alkenyl, alkynyl, cycloalkyl, heterocyclic, aryl, heteroaryl, aralkyl or heteroaralkyl group, wherein $R^4$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^5$ together represent the necessary atoms to form a cyclic structure.

In accordance with the present invention, the substituting group —N=N-Q may comprise the following formula

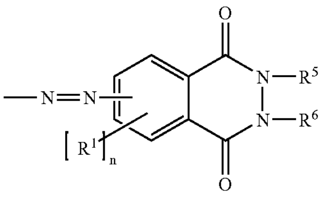

wherein n is 0, 1, 2 or 3, wherein each $R^1$ is selected from hydrogen, an optionally substituted alkyl, alkenyl, alkynyl, cycloalkyl, heterocyclic, aryl, heteroaryl, aralkyl or heteroaralkyl group, $—SO_2—NH—R^2$, $—NH—SO_2—R^4$, $—CO—NR^2R^3$, $—NR^2—CO—R^4$, $—O—CO—R^4$, $—CO—O—R^2$, $—CO—R^2$, $—SO_3—R^2$, $—SO_2—R^2$, $—SO—R^4$, $—P(=O)(—O—R^2)(—O—R^3)$, $—NR^2—R^3$, $—O—R^2$, $—S—R^2$, —CN, $—NO_2$, a halogen or $-M-R^2$, wherein M represents a divalent linking group containing 1 to 8 carbon atoms, wherein $R^2$, $R^3$, $R^5$ and $R^6$ are independently selected from hydrogen or an optionally substituted alkyl, alkenyl, alkynyl, cycloalkyl, heterocyclic, aryl, heteroaryl, aralkyl or heteroaralkyl group, wherein $R^4$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^4$ together represent the necessary atoms to form a cyclic structure, or wherein $R^5$ and $R^6$ together represent the necessary atoms to form a cyclic structure.

In accordance with the present invention, the substituting group —N=N-Q may comprise the following formula

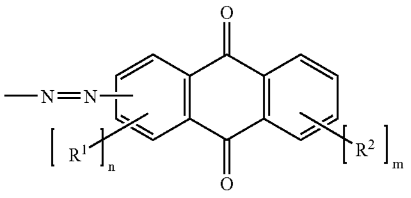

wherein n is 0, 1, 2 or 3, wherein m is 0, 1, 2, 3 or 4, wherein each $R^1$ and $R^2$ are independently selected from hydrogen, an optionally substituted alkyl, alkenyl, alkynyl, cycloalkyl, heterocyclic, aryl, heteroaryl, aralkyl or heteroaralkyl group, $—SO_2—NH—R^3$, $—NH—SO_2—R^5$, $—CO—NR^3—R^4$, $—NR^3—CO—R^5$, $—O—CO—R^5$, $—CO—O—R^3$, $—CO—R^3$, $—SO_3—R^3$, $—SO_2—R^3$, $—SO—R^5$, $—P(=O)(—O—R^3)(—O—R^4)$, $—NR^3—R^4$, $—O—R^3$, $—S—R^3$, —CN, $—NO_2$, a halogen or $-M-R^3$, wherein M represents a divalent linking group containing 1 to 8 carbon atoms, wherein $R^3$ and $R^4$ are independently selected from hydrogen or an optionally substituted alkyl, alkenyl, alkynyl, cycloalkyl, heterocyclic, aryl, heteroaryl, aralkyl or heteroaralkyl group, wherein $R^5$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^5$ together represent the necessary atoms to form a cyclic structure.

In accordance with the present invention, the substituting group —N=N-Q may comprise the following formula

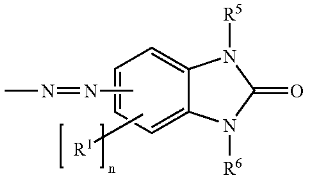

wherein n is 0, 1, 2 or 3, wherein each $R^1$ is selected from hydrogen, an optionally substituted alkyl, alkenyl, alkynyl, cycloalkyl, heterocyclic, aryl, heteroaryl, aralkyl or heteroaralkyl group, $—SO_2—NH—R^2$, $—NH—SO_2—R^4$, $—CO—NR^2—R^3$, $—NR^2—CO—R^4$, $—O—CO—R^4$, $—CO—O—R^2$, $—CO—R^2$, $—SO_3—R^2$, $—SO_2—R^2$, $—SO—R^4$, $—P(=O)(—O—R^2)(—O—R^3)$, $—NR^2—R^3$, $—O—R^2$, $—S—R^2$, —CN, $—NO_2$, a halogen or $-M-R^2$, wherein M represents a divalent linking group containing 1 to 8 carbon atoms, wherein $R^2$, $R^3$, $R^5$ and $R^6$ are independently selected from hydrogen or an optionally substituted alkyl, alkenyl, alkynyl, cycloalkyl, heterocyclic, aryl, heteroaryl, aralkyl or heteroaralkyl group, wherein $R^4$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^6$ together represent the necessary atoms to form a cyclic structure.

The polymers of this invention can be obtained via several routes, e.g. by reacting a polymer containing a phenolic monomeric unit with a diazonium salt or by reacting a phenolic monomer with a diazonium salt and subsequently polymerizing or polycondensating this reacted monomer. These pre-modified monomers can preferentially be copolymerized or copolycondensated with other monomers.

The reaction of a diazonium salt with a phenolic group under alkaline conditions produces a coupling of a diazo-group onto the aromatic ring structure and is schematically represented as shown in the following general scheme:

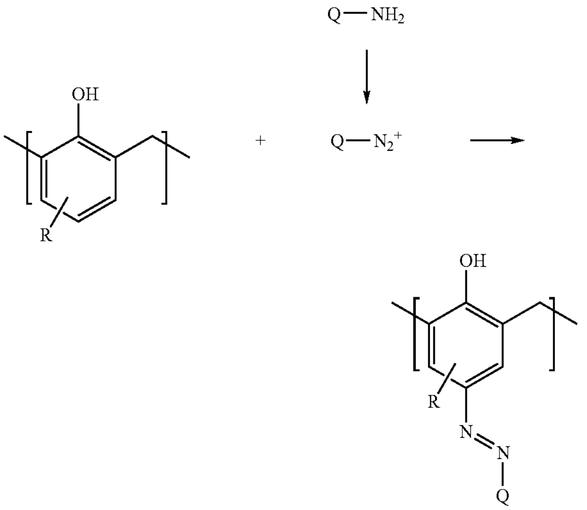

wherein Q represents an aromatic group and wherein R is a hydrogen atom or a substituent such as an alkyl group.

The diazonium salts for the purpose of this application can be derived from the diazotisation of a corresponding aromatic amine followed by a diazotising reagent, such as a nitrite salt, in the presence of an acid, such as HCl, $H_2SO_4$ or $H_3PO_4$. Most of the diazonium salts are relatively stable at low temperature such as about 0° C. to about 5° C. and they are soluble in water or in a mixture of water and an organic solvent such as acetic acid or 1-methoxy-2-propanol. A solution of the diazonium salt can be used for a further reaction with a solution of a polymer containing phenolic groups. By this azo-coupling reaction an aromatic diazo-group is substituted on the aromatic ring structure of the phenolic group. This azoic coupling can take place in the ortho-or para-position of the hydroxyl group, depending on the availability of these position for such a coupling reaction e.g. depending on which position the polycondensation reaction of the phenolic monomeric compounds and formaldehyde has taken place.

Examples of aromatic amines which can be diazotised to a diazonium salt, which can further be used in an azo-coupling with a phenolic group, are the following compounds:

AM-01:

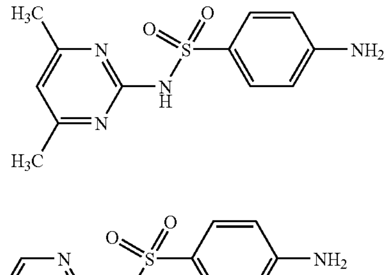

AM-02:

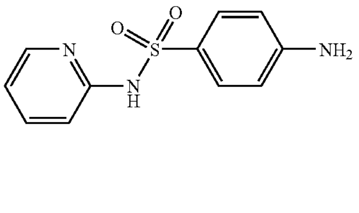

-continued
AM-03:
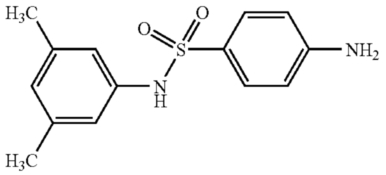
AM-04:
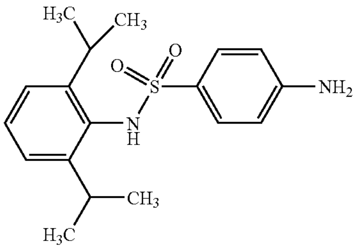
AM-05:
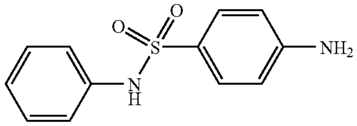
AM-06:
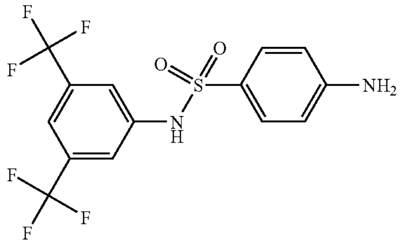
AM-07:
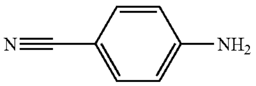
AM-08:
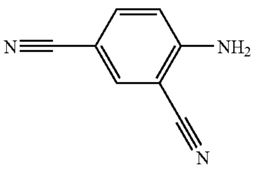
AM-10:
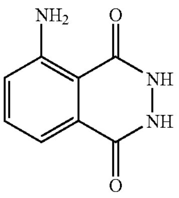
-continued
AM-14:
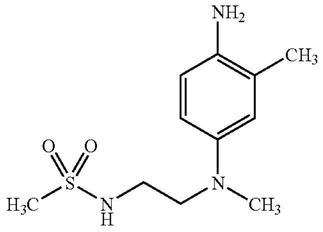
AM-15:
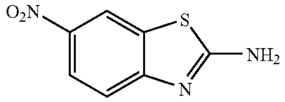
AM-16:
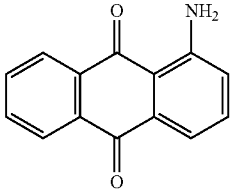
AM-17:
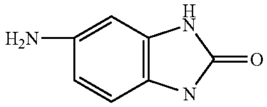
AM-18:
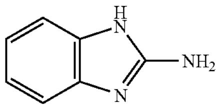
AM-19:
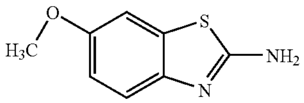
AM-20:
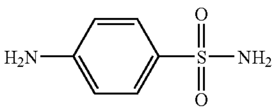
AM-21:
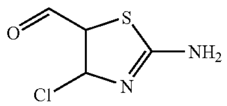
AM-22:
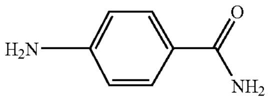
AM-27:
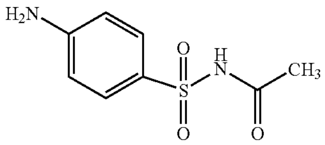

-continued

AM-28:

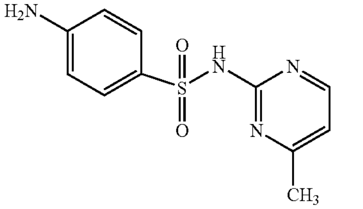

AM-29:

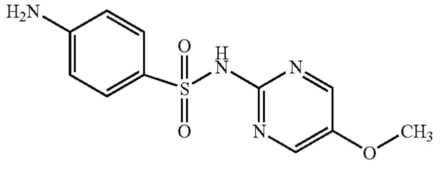

AM-30:

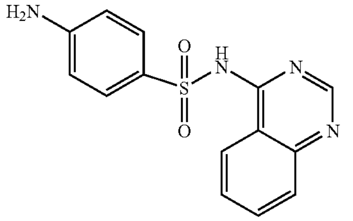

AM-31:

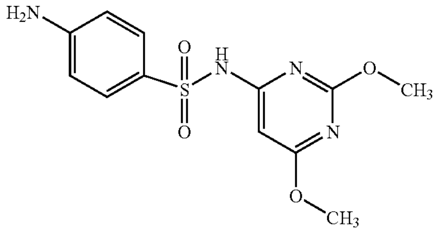

AM-32:

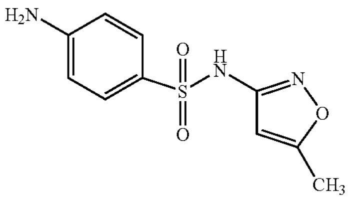

AM-33:

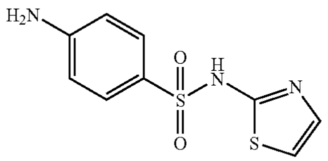

AM-34:

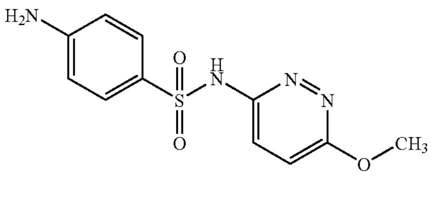

-continued

AM-35:

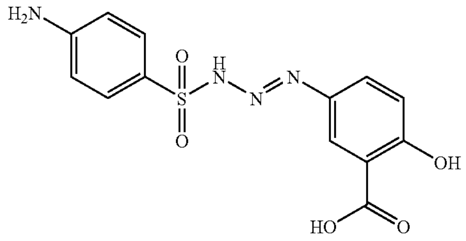

AM-36:

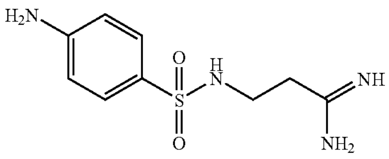

Polymers containing phenolic monomeric units can be a random, an alternating, a block or graft copolymer of different monomers and may be selected from e.g. polymers or copolymers of vinylphenol, novolac resins or resol resins. A novolac resin is preferred.

The novolac resin or resol resin may be prepared by polycondensation of at least one member selected from aromatic hydrocarbons such as phenol, o-cresol, p-cresol, m-cresol, 2,5-xylenol, 3,5-xylenol, resorcinol, pyrogallol, bisphenol, bisphenol A, trisphenol, o-ethylphenol, p-etylphenol, propylphenol, n-butylphenol, t-butylphenol, 1-naphtol and 2-naphtol, with at least one aldehyde or ketone selected from aldehydes such as formaldehyde, glyoxal, acetoaldehyde, propionaldehyde, benzaldehyde and furfural and ketones such as acetone, methyl ethyl ketone and methyl isobutyl ketone, in the presence of an acid catalyst. Instead of formaldehyde and acetaldehyde, paraformaldehyde and paraldehyde may, respectively, be used.

The weight average molecular weight, measured by gel permeation chromatography using universal calibration and polystyrene standards, of the novolac resin is preferably from 500 to 150,000 g/mol, more preferably from 1,500 to 15,000 g/mol.

The poly(vinylphenol) resin may also be a polymer of one or more hydroxy-phenyl containing monomers such as hydroxystyrenes or hydroxy-phenyl (meth)acrylates. Examples of such hydroxystyrenes are o-hydroxystyrene, m-hydroxystyrene, p-hydroxystyrene, 2-(o-hydroxyphenyl) propylene, 2-(m-hydroxyphenyl)propylene and 2-(p-hydroxyphenyl)propylene. Such a hydroxystyrene may have a substituent such as chlorine, bromine, iodine, fluorine or a $C_{1-4}$ alkyl group, on its aromatic ring. An example of such hydroxy-phenyl (meth)acrylate is 2-hydroxy-phenyl methacrylate.

The poly(vinylphenol) resin may usually be prepared by polymerizing one or more hydroxy-phenyl containing monomer in the presence of a radical initiator or a cationic polymerization initiator. The poly(vinylphenol) resin may also be prepared by copolymerizing one or more of these hydroxy-phenyl containing monomers with other monomeric compounds such as acrylate monomers, methacrylate monomers, acrylamide monomers, methacrylamide monomers, vinyl monomers, aromatic vinyl monomers or diene monomers.

The weight average molecular weight, measured by gel permeation chromatography using universal calibration and polystyrene standards, of the poly(vinylphenol) resin is preferably from 1.000 to 200,000 g/mol, more preferably from 1,500 to 50,000 g/mol.

Examples of polymers containing phenolic monomeric units which can be modified with a diazonium salt are:

POL-01: ALNOVOL SPN452 is a solution of a novolac resin, 40% by weight in Dowanol PM, obtained from CLARIANT GmbH.

Dowanol PM consists of 1-methoxy-2-propanol (>99.5%) and 2-methoxy-1-propanol (<0.5%).

POL-02: ALNOVOL SPN400 is a solution of a novolac resin, 44% by weight in Dowanol PMA, obtained from CLARIANT GmbH.

Dowanol PMA consists of 2-methoxy-1-methyl-ethylacetate.

POL-03: ALNOVOL HPN100 a novolac resin obtained from CLARIANT GmbH.

POL-04: DURITE PD443 is a novolac resin obtained from BORDEN CHEM. INC.

POL-05: DURITE SD423A is a novolac resin obtained from BORDEN CHEM. INC.

POL-06: DURITE SD126A is a novolac resin obtained from BORDEN CHEM. INC.

POL-07: BAKELITE 6866LB02 is a novolac resin obtained from BAKELITE AG.

POL-08: BAKELITE 6866LB03 is a novolac resin obtained from BAKELITE AG.

POL-09: KR 400/8 is a novolac resin obtained from KOYO CHEMICALS INC.

POL-10: HRJ 1085 is a novolac resin obtained from SCHNECTADY INTERNATIONAL INC.

POL-11: HRJ 2606 is a phenol novolac resin obtained from SCHNECTADY INTERNATIONAL INC.

POL-12: LYNCUR CMM is a copolymer of 4-hydroxystyrene and methyl methacrylate obtained from SIBER HEGNER.

The polymer of the present invention may contain more than one type of an azo-aryl group. In this situation each type of azo-aryl groups can be incorporated successively or a mixture of different diazonium salts can be reacted onto the polymer. The preferred amount of each type of azo-aryl group incorporated in the polymer is between 0.5 mol % and 80 mol %, more preferably between 1 mol % and 60 mol %, most preferably 2 mol % and 50 mol %.

Also other polymers, such as unmodified phenolic resins, can be added to the coating composition. The polymer of the present invention are preferably added to the coating in a concentration range of 5% by weight to 98% by weight of the total coating, more preferably between 10% by weight to 95% by weight.

If the heat-sensitive coating is composed of more than one layer, the polymer of the present invention is present in at least one of these layers, e.g. in a top-layer. The polymer can also be present in more than one layer of the coating, e.g. in a top-layer and in an intermediate layer.

The support has a hydrophilic surface or is provided with a hydrophilic layer. The support may be a sheet-like material such as a plate or it may be a cylindrical element such as a sleeve which can be slid around a print cylinder of a printing press. Preferably, the support is a metal support such as aluminum or stainless steel.

A particularly preferred lithographic support is an electrochemically grained and anodized aluminum support.

Graining and anodizing of aluminum lithographic supports is well known. The grained aluminum support used in the material of the present invention is preferably an electrochemically grained support. The acid used for graining can be e.g. nitric acid. The acid used for graining preferably comprises hydrogen chloride. Also mixtures of e.g. hydrogen chloride and acetic acid can be used.

The grained and anodized aluminum support may be post-treated to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with an organic acid and/or salt thereof, e.g. carboxylic acids, hydroxycarboxylic acids, sulfonic acids or phosphonic acids, or their salts, e.g. succinates, phosphates, phosphonates, sulfates, and sulfonates. A citric acid or citrate solution is preferred. This treatment may be carried out at room temperature or may be carried out at a slightly elevated temperature of about 30 to 50° C. A further post-treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde. It is further evident that one or more of these post-treatments may be carried out alone or in combination. More detailed descriptions of these treatments are given in GB-A-1 084 070, DE-A-4 423 140, DE-A-4 417 907, EP-A-659 909, EP-A-537 633, DE-A-4 001 466, EP-A-292 801, EP-A-291 760 and U.S. Pat. No. 4,458,005.

According to another embodiment, the support can also be a flexible support, which is provided with a hydrophilic layer, hereinafter called 'base layer'. The flexible support is e.g. paper, plastic film, thin aluminum or a laminate thereof. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 μm and is preferably 1 to 10 μm.

The hydrophilic binder for use in the base layer is e.g. a hydrophilic (co)polymer such as homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60% by weight, preferably 80% by weight.

The amount of hardening agent, in particular tetraalkyl orthosilicate, is preferably at least 0.2 parts per part by weight of hydrophilic binder, more preferably between 0.5 and 5 parts by weight, most preferably between 1 parts and 3 parts by weight.

The hydrophilic base layer may also contain substances that increase the mechanical strength and the porosity of the layer. For this purpose colloidal silica may be used. The colloidal silica employed may be in the form of any commercially available water dispersion of colloidal silica for example having an average particle size up to 40 nm, e.g. 20 nm. In addition inert particles of larger size than the colloidal silica may be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the hydrophilic base layer is given a uniform rough texture consisting of microscopic hills and valleys, which serve as storage places for water in background areas.

Particular examples of suitable hydrophilic base layers for use in accordance with the present invention are disclosed in EP-A-601 240, GB-P-1 419 512, FR-P-2 300 354, U.S. Pat. No. 3,971,660, and U.S. Pat. No. 4,284,705.

It is particularly preferred to use a film support to which an adhesion improving layer, also called support layer, has been provided. Particularly suitable adhesion improving layers for use in accordance with the present invention comprise a hydrophilic binder and colloidal silica as disclosed in EP-A-619 524, EP-A-620 502 and EP-A-619 525. Preferably, the amount of silica in the adhesion improving layer is between 200 mg/$m^2$ and 750 mg/$m^2$ Further, the ratio of silica to hydrophilic binder is preferably more than 1 and the surface area of the colloidal silica is preferably at least 300 $m^2$/gram, more preferably at least 500 $m^2$ gram.

The coating provided on the support is heat-sensitive and can preferably be handled in normal working lighting conditions (daylight, fluorescent light) for several hours. The coating preferably does not contain UV-sensitive compounds which have an absorption maximum in the wavelength range of 200 nm to 400 nm such as diazo compounds, photoacids, photoinitiators, quinone diazides, or sensitizers. Preferably the coating neither contains compounds which have an absorption maximum in the blue and green visible light wavelength range between 400 and 600 nm.

According to one embodiment, the printing plate precursor is positive-working, i.e. after exposure and development the exposed areas of the oleophilic layer are removed from the support and define hydrophilic, non-image (non-printing) areas, whereas the unexposed layer is not removed from the support and defines an oleophilic image (printing) area. According to another embodiment, the printing plate precursor is negative-working, i.e. the image areas correspond to the exposed areas.

The coating may comprise one or more distinct layers. Besides the layers discussed hereafter, the coating may further comprise e.g. a “subbing” layer which improves the adhesion of the coating to the support, a covering layer which protects the coating against contamination or mechanical damage, and/or a light-to-heat conversion layer which comprises an infrared light absorbing compound.

A suitable negative-working alkaline developing printing plate comprises a phenolic resin and a latent Brönsted acid which produces acid upon heating or IR radiation. These acids catalyze crosslinking of the coating in a post-exposure heating step and thus hardening of the exposed regions. Accordingly, the non-exposed regions can be washed away by a developer to reveal the hydrophilic substrate underneath. For a more detailed description of such a negative-working printing plate precursor we refer to U.S. Pat. No. 6,255,042 and U.S. Pat. No. 6,063,544 and to references cited in these documents. In such a negative-working lithographic printing plate precursor, the polymer of the present invention is added to the coating composition and replaces at least part of the phenolic resin.

In a positive-working lithographic printing plate precursor, the coating is capable of heat-induced solubilization, i.e. the coating is resistant to the developer and ink-accepting in the non-exposed state and becomes soluble in the developer upon exposure to heat or infrared light to such an extent that the hydrophilic surface of the support is revealed thereby.

Besides the polymer of the present invention, the coating may contain additional polymeric binders that are soluble in an aqueous alkaline developer. Preferred polymers are phenolic resins, e.g. novolac, resoles, polyvinyl phenols and carboxy-substituted polymers. Typical examples of such polymers are described in DE-A-4007428, DE-A-4027301 and DE-A-4445820.

In a preferred positive-working lithographic printing plate precursor, the coating also contains one or more dissolution inhibitors. Dissolution inhibitors are compounds which reduce the dissolution rate of the hydrophobic polymer in the aqueous alkaline developer at the non-exposed areas of the coating and wherein this reduction of the dissolution rate is destroyed by the heat generated during the exposure so that the coating readily dissolves in the developer at exposed areas. The dissolution inhibitor exhibits a substantial latitude in dissolution rate between the exposed and non-exposed areas. By preference, the dissolution inhibitor has a good dissolution rate latitude when the exposed coating areas have dissolved completely in the developer before the non-exposed areas are attacked by the developer to such an extent that the ink-accepting capability of the coating is affected. The dissolution inhibitor(s) can be added to the layer which comprises the hydrophobic polymer discussed above.

The dissolution rate of the non-exposed coating in the developer is preferably reduced by interaction between the hydrophobic polymer and the inhibitor, due to e.g. hydrogen bonding between these compounds. Suitable dissolution inhibitors are preferably organic compounds which comprise at least one aromatic group and a hydrogen bonding site, e.g. a carbonyl group, a sulfonyl group, or a nitrogen atom which may be quaternized and which may be part of a heterocyclic ring or which may be part of an amino substituent of said organic compound. Suitable dissolution inhibitors of this type have been disclosed in e.g. EP-A 825927 and 823327.

Water-repellent polymers represent an another type of suitable dissolution inhibitors. Such polymers seem to increase the developer resistance of the coating by repelling the aqueous developer from the coating. The water-repellent polymers can be added to the layer comprising the hydrophobic polymer and/or can be present in a separate layer provided on top of the layer with the hydrophobic polymer. In the latter embodiment, the water-repellent polymer forms a barrier layer which shields the coating from the developer and the solubility of the barrier layer in the developer or the penetrability of the barrier layer by the developer can be increased by exposure to heat or infrared light, as described in e.g. EP-A 864420, EP-A 950517 and WO99/21725. Preferred examples of the water-repellent polymers are polymers comprising siloxane and/or perfluoroalkyl units. In one embodiment, the coating contains such a water-repellent polymer in an amount between 0.5 and 25 mg/$m^2$ preferably between 0.5 and 15 mg/$m^2$ and most preferably between 0.5 and 10 mg/$m^2$. When the water-repellent polymer is also ink-repelling, e.g. in the case of polysiloxanes, higher amounts than 25 mg/$m^2$ can result in poor ink-acceptance of the non-exposed areas. An amount lower than 0.5 mg/$m^2$ on the other hand may lead to an unsatisfactory development resistance. The polysiloxane may be a linear, cyclic or complex cross-linked polymer or copolymer. The term polysiloxane compound shall include any compound which contains more than one siloxane group —Si(R,R')—O—, wherein R and R' are optionally substituted alkyl or aryl groups. Preferred siloxanes are phenylalkylsiloxanes and dialkylsiloxanes. The number of siloxane groups in the (co)polymer is at least 2, preferably at least 10, more preferably at least 20. It may be less than 100, preferably less than 60. In another embodiment, the water-repellent polymer is a block-copolymer or a graft-copolymer of a poly (alkylene oxide) block and a block of a polymer comprising siloxane and/or perfluoroalkyl units. A suitable copolymer comprises about 15 to 25 siloxane units and 50 to 70 alkylene oxide groups. Preferred examples include copolymers comprising phenylmethylsiloxane and/or dimethylsiloxane as well as ethylene oxide and/or propylene oxide, such as Tego Glide 410, Tego Wet 265, Tego Protect 5001 or Silikophen P50/X, all commercially available from Tego Chemie, Essen, Germany. Such a copolymer acts as a surfactant which upon coating, due to its bifunctional structure, automatically positions itself at the interface between the coating and air and thereby forms a separate top layer even when the whole coating is applied from a single coating solution. Simultaneously, such surfactants act as a spreading agent which improves the coating quality. Alternatively, the water-repellent polymer can be applied in a second solution, coated on top of the layer comprising the hydrophobic polymer. In that embodiment, it may be advantageous to use a solvent in the second coating solution that is not capable of dissolving the ingredients present in the first layer so that a highly concentrated water-repellent phase is obtained at the top of the coating.

Preferably, also one or more development accelerators are included in the coating, i.e. compounds which act as dissolution promoters because they are capable of increasing the dissolution rate of the non-exposed coating in the developer. The simultaneous application of dissolution inhibitors and accelerators allows a precise fine tuning of the dissolution behavior of the coating. Suitable dissolution accelerators are cyclic acid anhydrides, phenols or organic acids. Examples of the cyclic acid anhydride include phthalic anhydride, tetrahydrophthalic anhydride, hexahydrophthalic anhydride, tetrachlorophthalic anhydride, maleic anhydride, chloromaleic anhydride, alpha-phenylmaleic anhydride, succinic anhydride, and pyromellitic anhydride, as described in U.S. Pat. No. 4,115,128. Examples of the phenols include bisphenol A, p-nitrophenol, p-ethoxyphenol, 2,4,4'-trihydroxybenzophenone, 2,3,4-trihydroxy-benzophenone, 4-hydroxybenzophenone, 4,4',4"-trihydroxy-triphenylmethane, and 4,4',3",4"-tetrahydroxy-3,5,3',5'-tetramethyltriphenyl-methane, and the like. Examples of the organic acids include sulfonic acids, sulfinic acids, alkylsulfuric acids, phosphonic acids, phosphates, and carboxylic acids, as described in, for example, JP-A Nos. 60-88, 942 and 2-96, 755. Specific examples of these organic acids include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid. The amount of the cyclic acid anhydride, phenol, or organic acid contained in the coating is preferably in the range of 0.05 to 20% by weight, relative to the coating as a whole.

The polymer which contains a phenolic monomeric unit modified as described in the present invention, can be used in conventional photosensitive printing plate precursors wherein at least part of the conventional phenolic polymer is replaced by at least one of the polymers modified as described in the present invention.

According to a more preferred embodiment, the material of the present invention is image-wise exposed to infrared light, which is converted into heat by an infrared light absorbing agent, which may be a dye or pigment having an absorption maximum in the infrared wavelength range. The concentration of the sensitizing dye or pigment in the coating is typically between 0.25 and 10.0 wt. %, more preferably between 0.5 and 7.5 wt. % relative to the coating as a whole. Preferred IR-absorbing compounds are dyes such as cyanine or merocyanine dyes or pigments such as carbon black. A suitable compound is the following infrared dye:

IR-1

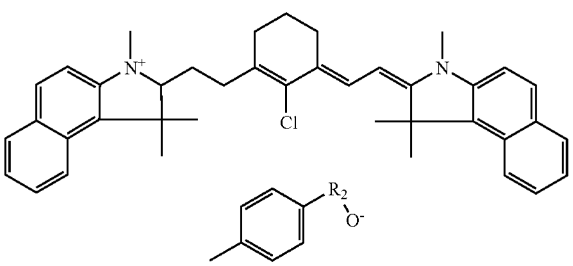

The coating may further contain an organic dye which absorbs visible light so that a perceptible image is obtained upon image-wise exposure and subsequent development. Such a dye is often called contrast dye or indicator dye. Preferably, the dye has a blue color and an absorption maximum in the wavelength range between 600 nm and 750 nm. Although the dye absorbs visible light, it preferably does not sensitize the printing plate precursor, i.e. the coating does not become more soluble in the developer upon exposure to visible light. Suitable examples of such a contrast dye are the quaternized triarylmethane dyes. Another suitable compound is the following dye:

CD-1

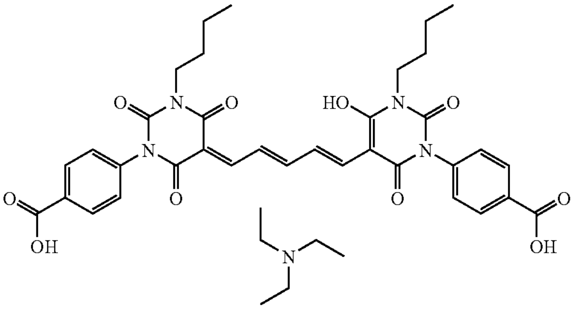

The infrared light absorbing compound and the contrast dye may be present in the layer comprising the hydrophobic polymer, and/or in the barrier layer discussed above and/or in an optional other layer. According to a highly preferred embodiment, the infrared light absorbing compound is concentrated in or near the barrier layer, e.g. in an intermediate layer between the layer comprising the hydrophobic polymer and the barrier layer.

The printing plate precursor of the present invention can be exposed to infrared light with LEDs or a laser. Preferably, a laser emitting near infrared light having a wavelength in the range from about 750 to about 1500 nm is used, such as a semiconductor laser diode, a Nd:YAG or a Nd:YLF laser. The required laser power depends on the sensitivity of the image-recording layer, the pixel dwell time of the laser beam, which is determined by the spot diameter (typical value of modern plate-setters at $1/e^2$ of maximum intensity: 10–25 μm), the scan speed and the resolution of the exposure apparatus (i.e. the number of addressable pixels per unit of linear distance, often expressed in dots per inch or dpi; typical value: 1000–4000 dpi).

Two types of laser-exposure apparatuses are commonly used: internal (ITD) and external drum (XTD) plate-setters. ITD plate-setters for thermal plates are typically characterized by a very high scan speed up to 1500 m/sec and may require a laser power of several Watts. The Agfa Galileo T is a typical example of a plate-setter using the ITD-technology. XTD plate-setters operate at a lower scan speed typically from 0.1 m/sec to 10 m/sec and have a typical laser-output-power per beam from 20 mW up to 500 mW. The Creo Trendsetter plate-setter family and the Agfa Excalibur plate-setter family both make use of the XTD-technology.

The known plate-setters can be used as an off-press exposure apparatus, which offers the benefit of reduced press down-time. XTD plate-setter configurations can also be used for on-press exposure, offering the benefit of immediate registration in a multi-color press. More technical details of on-press exposure apparatuses are described in e.g. U.S. Pat. No. 5,174,205 and U.S. Pat. No. 5,163,368.

In the development step, the non-image areas of the coating can be removed by immersion in an aqueous alkaline developer, which may be combined with mechanical rubbing, e.g. by a rotating brush. The developer preferably has a pH above 10, more preferably above 12. The development step may be followed by a rinsing step, a gumming step, a drying step and/or a post-baking step.

The printing plate thus obtained can be used for conventional, so-called wet offset printing, in which ink and an aqueous dampening liquid is supplied to the plate. Another suitable printing method uses so-called single-fluid ink without a dampening liquid. Single-fluid ink consists of an ink phase, also called the hydrophobic or oleophilic phase, and a polar phase which replaces the aqueous dampening liquid that is used in conventional wet offset printing. Suitable examples of single-fluid inks have been described in U.S. Pat. No. 4,045,232; U.S. Pat. No. 4,981,517 and U.S. Pat. No. 6,140,392. In a most preferred embodiment, the single-fluid ink comprises an ink phase and a polyol phase as described in WO 00/32705.

EXAMPLES

Preparation of Polymer MP-01

Diazonium Solution:

A mixture of 3.13 g AM-01, 45 ml 1-methoxy-2-propanol and 9 ml water was stirred and cooled to 5° C. Then 4.7 ml concentrated HCl was added and the mixture was cooled to 0° C. Then a solution of 0.85 g $NaNO_2$ in 5 ml water was added dropwise after which stirring was continued for another 10 minutes at 0° C.

Phenolic Polymer Solution:

A mixture of 137.7 g of POL-01 solution (40% by weight), 11.5 g $NaOAc.3H_2O$ and 225 ml 1-methoxy-2-propanol was stirred and cooled to 0° C.

The above prepared diazonium solution was added dropwise to the phenolic polymer solution over a 10 minute period after which stirring was continued for 30 minutes at 0° C. and 2 hours at room temperature. The resulting mixture was then added to 1.5 liters ice-water over a 30 minute period while continuously stirring. The polymer precipitated from the aqueous medium and was isolated by filtration. The desired product was finally obtained by washing with water and subsequent drying at 45° C.

Preparation of Polymer MP-02

Diazonium Solution:

A mixture of 6.3 g AM-01, 90 ml 1-methoxy-2-propanol and 18 ml water was stirred and cooled to 5° C. Then 9.5 ml concentrated HCl was added and the mixture was cooled to 0° C. Then a solution of 1.7 g $NaNO_2$ in 18 ml water was added dropwise after which stirring was continued for another 10 minutes at 0° C.

Phenolic Polymer Solution:

A mixture of 137.7 g of POL-01 solution (40% by weight), 23 g $NaOAc.3H_2O$ and 450 ml 1-methoxy-2-propanol was stirred and cooled to 0° C.

The above prepared diazonium solution was added dropwise to the phenolic polymer solution over a 20 minute period after which stirring was continued for 30 minutes at 0° C. and 2 hours at room temperature. The resulting mixture was then added to 1.5 liters ice-water over a 30 minute period while continuously stirring. The polymer precipitated from the aqueous medium and was isolated by filtration. The desired product was finally obtained by washing with water and subsequent drying at 45° C.

Preparation of Polymer MP-03

Diazonium Solution:

A mixture of 12.5 g AM-01, 180 ml 1-methoxy-2-propanol and 36 ml water was stirred and cooled to 5° C. Then 19 ml concentrated HCl was added and the mixture was cooled to 0° C. Then a solution of 3.4 g $NaNO_2$ in 20 ml water was added dropwise after which stirring was continued for another 10 minutes at 0° C.

Phenolic Polymer Solution:

A mixture of 137.7 g of POL-01 solution (40% by weight), 46 g $NaOAc.3H_2O$ and 450 ml 1-methoxy-2-propanol was stirred and cooled to 0° C.

The above prepared diazonium solution was added dropwise to the phenolic polymer solution over a 30 minute period after which stirring was continued for 30 minutes at 0° C. and 2 hours at room temperature. The resulting mixture was then added to 1.5 liters ice-water over a 30 minute period while continuously stirring. The polymer precipitated from the aqueous medium and was isolated by filtration. The desired product was finally obtained by washing with water and subsequent drying at 45° C.

Preparation of Polymer MP-04

Diazonium Solution:

A mixture of 31.3 g AM-01, 300 ml 1-methoxy-2-propanol and 90 ml water was stirred and cooled to 5° C. Then 47 ml concentrated HCl was added and the mixture was cooled to 0° C. Then a solution of 8.54 g $NaNO_2$ in 50 ml water was added dropwise after which stirring was continued for another 10 minutes at 0° C.

Phenolic Polymer Solution:

A mixture of 137.7 g of POL-01 solution (40% by weight), 115 g $NaOAc.3H_2O$ and 200 ml 1-methoxy-2-propanol was stirred and cooled to 0° C.

The above prepared diazonium solution was added dropwise to the phenolic polymer solution over a 60 minute period after which stirring was continued for 30 minutes at 0° C. and 2 hours at room temperature. The resulting mixture was then added to 1.5 liters ice-water over a 30 minute period while continuously stirring. The polymer precipitated from the aqueous medium and was isolated by filtration. The desired product was finally obtained by washing with water and subsequent drying at 45° C.

Preparation of Polymer MP-05

Diazonium Solution:

A mixture of 50 g AM-01, 480 ml 1-methoxy-2-propanol and 145 ml water was stirred and cooled to 5° C. Then 75 ml concentrated HCl was added and the mixture was cooled to 0° C. Then a solution of 13.6 g $NaNO_2$ in 80 ml water was added dropwise after which stirring was continued for another 10 minutes at 0° C.

Phenolic Polymer Solution:

A mixture of 137.7 g of POL-01 solution (40% by weight), 184 g $NaOAc.3H_2O$ and 400 ml 1-methoxy-2-propanol was stirred and cooled to 0° C.

The above prepared diazonium solution was added dropwise to the phenolic polymer solution over a 60 minute period after which stirring was continued for 30 minutes at 0° C. and 2 hours at room temperature. The resulting mixture was then added to 1.5 liters ice-water over a 30 minute period while continuously stirring. The polymer precipitated from the aqueous medium and was isolated by filtration. The desired product was finally obtained by washing with water and subsequent drying at 45° C.

Preparation of Polymer MP-06

The preparation of polymer MP-06 was carried out in the same way as that of polymer MP-04 with the exception that 31.1 g AM-03 was used instead of 31.3 g AM-01 and that in the mixture of 137.7 g of POL-01 solution (40% by weight) and 115 g $NaOAc.3H_2O$ 1000 ml 1-methoxy-2-propanol was added instead of 200 ml 1-methoxy-2-propanol.

Preparation of Polymer MP-07

Diazonium Solution:

A mixture of 17.4 g AM-01, 80 ml 1-methoxy-2-propanol and 40 ml water was stirred and cooled to 5° C. Then 26 ml concentrated HCl was added and the mixture was cooled to 0° C. Then a solution of 4.7 g $NaNO_2$ in 15 ml water was added dropwise after which stirring was continued for another 10 minutes at 0° C.

Phenolic Polymer Solution:

A mixture of 30.0 g POL-04 dissolved in 125 ml 1-methoxy-2-propanol and 64 g $NaOAc.3H_2O$ was stirred and cooled to 0° C.

The above prepared diazonium solution was added dropwise to the phenolic polymer solution over a 30 minute period after which stirring was continued for 30 minutes at 0° C. and 2 hours at room temperature. 50 ml 1-methoxy-2-propanol and 50 ml N,N-dimethylacetamide were added to dissolve the precipitated product. The resulting mixture was then added to 3 liters ice-water over a 30 minute period while continuously stirring. The polymer precipitated from the aqueous medium and was isolated by filtration. The desired product was finally obtained by washing with water and subsequent drying at 45° C.

Preparation of Polymer MP-08

Diazonium Solution:

A mixture of 17.4 g AM-01, 80 ml 1-methoxy-2-propanol and 40 ml water was stirred and cooled to 5° C. Then 26 ml concentrated HCl was added and the mixture was cooled to 0° C. Then a solution of 4.7 g $NaNO_2$ in 15 ml water was added dropwise after which stirring was continued for another 10 minutes at 0° C.

Phenolic Polymer Solution:

A mixture of 30.0 g POL-05 dissolved in 125 ml 1-methoxy-2-propanol and 64 g $NaOAc.3H_2O$ was stirred and cooled to 0° C.

The above prepared diazonium solution was added dropwise to the phenolic polymer solution over a 30 minute period after which stirring was continued for 30 minutes at 0° C. and 2 hours at room temperature. The resulting mixture was then added to 3 liters ice-water over a 30 minute period while continuously stirring. The polymer precipitated from the aqueous medium and was isolated by filtration. The desired product was finally obtained by washing with water and subsequent drying at 45° C.

Preparation of Polymer MP-09

The preparation of polymer MP-09 was carried out in the same way as that of polymer MP-08 with the exception that 30 g of the phenolic polymer POL-06 dissolved in 125 ml 1-methoxy-2-propanol was used instead of POL-05.

Preparation of Polymer MP-10

Diazonium Solution:

A mixture of 17.4 g AM-01 and 100 ml acetic acid was stirred and cooled to 5° C. Then 15 ml concentrated HCl was added and the mixture was cooled to 0° C. Then a solution of 4.7 g $NaNO_2$ in 15 ml water was added dropwise after which stirring was continued for another 10 minutes at 0° C.

Phenolic Polymer Solution:

A mixture of 30.6 g POL-07 dissolved in 200 ml 1-methoxy-2-propanol, 50 ml N,N-dimethylacetamide and 68 g $NaOAc.3H_2O$ was stirred and cooled to 0° C.

The above prepared diazonium solution was added dropwise to the phenolic polymer solution over a 30 minute period after which stirring was continued for 30 minutes at 0° C. and 2 hours at room temperature. The resulting mixture was then added to 3 liters ice-water over a 30 minute period while continuously stirring. The polymer precipitated from the aqueous medium and was isolated by filtration. The desired product was finally obtained by washing with water and with a mixture water/methanol (volume ratio: 7/3) and subsequent drying at 45° C.

Preparation of Polymer MP-11

Diazonium Solution:

A mixture of 27.8 g AM-01, 260 ml 1-methoxy-2-propanol and 78 ml water was stirred and cooled to 5° C. Then 42 ml concentrated HCl was added and the mixture was cooled to 0° C. Then a solution of 7.6 g $NaNO_2$ in 44 ml water was added dropwise after which stirring was continued for another 10 minutes at 0° C.

Phenolic Polymer Solution:

A mixture of 49.0 g POL-08 dissolved in 280 ml N,N-dimethylacetamide and 102 g $NaOAc.3H_2O$ was stirred and cooled to 0° C.

The above prepared diazonium solution was added dropwise to the phenolic polymer solution over a 60 minute period after which stirring was continued for 30 minutes at 0° C. and 2 hours at room temperature. The resulting mixture was then added to 3.5 liters ice-water over a 30 minute period while continuously stirring. The polymer precipitated from the aqueous medium and was isolated by filtration. The desired product was finally obtained by washing with water and subsequent drying at 45° C.

Preparation of Polymer MP-12

The preparation of polymer MP-12 was carried out in the same way as that of polymer MP-11 with the exception that 48 g of the phenolic polymer POL-09 dissolved in 270 ml N,N-dimethylacetamide was used instead of POL-08.

Preparation of Polymer MP-13

The preparation of polymer MP-13 was carried out in the same way as that of polymer MP-11 with the exception that 48 g of the phenolic polymer POL-10 dissolved in 280 ml N,N-dimethylacetamide was used instead of POL-08.

Preparation of Polymer MP-14

The preparation of polymer MP-14 was carried out in the same way as that of polymer MP-11 with the exception that 48 g of the phenolic polymer POL-11 dissolved in 235 ml N,N-dimethylacetamide was used instead of POL-08.

Preparation of Polymer MP-15

The preparation of polymer MP-15 was carried out in the same way as that of polymer MP-04 with the exception that a mixture of 13.3 g AM-07, dissolved in 300 ml 1-methoxy-2-propanol and 200 ml water was used instead of AM-01.

Preparation of Polymer MP-16

The preparation of polymer MP-16 was carried out in the same way as that of polymer MP-05 with the exception that a mixture of 21.3 g AM-07 dissolved in 480 ml 1-methoxy-2-propanol and 180 ml water was used instead of AM-01.

Preparation of Polymer MP-17

The preparation of polymer MP-17 was carried out in the same way as that of polymer MP-03 with the exception that a mixture of 5.3 g AM-07 dissolved in 120 ml 1-methoxy-2-propanol and 80 ml water was used and that a mixture of 125.2 g of POL-02 solution (44% by weight), 46 g $NaOAc.3H_2O$ and 200 ml 1-methoxy-2-propanol was used.

Preparation of Polymer MP-18

The preparation of polymer MP-18 was carried out in the same way as that of polymer MP-04 with the exception that a mixture of 13.3 g AM-07 dissolved in 300 ml 1-methoxy-2-propanol and 200 ml water was used and that a mixture of 125.2 g of POL-02 solution (44% by weight), 115 g $NaOAc.3H_2O$ and 300 ml 1-methoxy-2-propanol was used.

Preparation of Polymer MP-19

Diazonium Solution:

A mixture of 16.1 g AM-08, 299 ml acetic acid and 25 ml concentrated HCl was stirred at 45° C. After all the AM-08 had dissolved, the solution was cooled to 5° C. Then 5 ml concentrated $H_2SO_4$ was added and the mixture was further stirred and cooled to 0° C. Then a solution of 9.0 g $NaNO_2$ in 20 ml water was added dropwise after which stirring was continued for another 20 minutes at 0° C.

Phenolic Polymer Solution:

A mixture of 137.7 g of POL-01 solution (40% by weight), 68 g $NaOAc.3H_2O$ and 300 ml 1-methoxy-2-propanol was stirred and cooled to 0° C.

The above prepared diazonium solution was added dropwise to the phenolic polymer solution over a 30 minute period after which stirring was continued for 30 minutes at 0° C. and 30 minutes at 10° C. The resulting mixture was then added to 2.5 liters ice-water over a 30 minute period while continuously stirring. The polymer precipitated from the aqueous medium and was isolated by filtration. The desired product was finally obtained by washing with water and with a mixture water/methanol (volume ratio: 6/4) and subsequent drying at 45° C.

Preparation of Polymer MP-20

Diazonium Solution:

A mixture of 6.6 g AM-10 and 65 ml acetic and 37.5 ml water was cooled to 15° C. Then 6.2 ml concentrated HCl was added and the mixture was further cooled to 0° C. Then a solution of 2.8 g $NaNO_2$ in 7 ml water was added dropwise after which stirring was continued for another 30 minutes at 0° C.

Phenolic Polymer Solution:

A mixture of 45.9 g POL-01 solution (40% by weight), 40.8 g $NaOAc.3H_2O$ and 200 ml 1-methoxy-2-propanol was stirred and cooled to 10° C.

The above prepared diazonium solution was added dropwise to the phenolic polymer solution over a 30 minute period after which stirring was continued for 120 minutes at 15° C. The resulting mixture was then added to 2 liters ice-water over a 30 minute period while continuously stirring. The polymer precipitated from the aqueous medium and was isolated by filtration. The desired product was finally obtained by washing with water and subsequent drying at 45° C.

Preparation of Polymer MP-21

The preparation of polymer MP-21 was carried out in the same way as that of polymer MP-20 with the exception that in the preparation of the diazonium salt a mixture of 5.3 g AM-10 and 50 ml of acetic acid, 5 ml concentrated HCl and 2.3 g $NaNO_2$ in 6 ml water were used, and that in the preparation of the phenolic polymer solution 32.6 g $NaOAc.3H_2O$ was used instead of the quantities given in the preparation of polymer MP-20.

Preparation of Polymer MP-22

The preparation of polymer MP-22 was carried out in the same way as that of polymer MP-20 with the exception that in the preparation of the diazonium salt a mixture of 2.6 g AM-10 and 25 ml of acetic acid, 2.5 ml concentrated HCl and 1.1 g $NaNO_2$ in 3 ml water were used, and that in the preparation of the phenolic polymer solution 16.3 g $NaOAc.3H_2O$ was used instead of the quantities given in the preparation of polymer MP-20.

Preparation of Polymer MP-23

The preparation of polymer MP-23 was carried out in the same way as that of polymer MP-20 with the exception that in the preparation of the diazonium salt a mixture of 1.33 g AM-10 and 15 ml of acetic acid, 1.3 ml concentrated HCl and 0.57 g $NaNO_2$ in 2 ml water were used, and that in the preparation of the phenolic polymer solution 8.2 g $NaOAc.3H_2O$ was used instead of the quantities given in the preparation of polymer MP-20.

Preparation of Polymer MP-28 a) First Modification Reaction on the Phenolic Polymer:

Diazonium Solution:

A mixture of 27.9 g AM-01, 240 ml 1-methoxy-2-propanol and 60 ml water was stirred and cooled to 5° C. Then 42 ml concentrated HCl was added and the mixture was cooled to 0° C. Then a solution of 7.6 g $NaNO_2$ in 30 ml water was added dropwise after which stirring was continued for another 20 minutes at 0° C.

Phenolic Polymer Solution:

A mixture of 306 g POL-01 solution (40% by weight), 102 g $NaOAc.3H_2O$ and 200 ml 1-methoxy-2-propanol was stirred and cooled to 0° C.

The above prepared diazonium solution was added dropwise to the phenolic polymer solution over a 60 minute period after which stirring was continued for 30 minutes at 0° C. and 2 hours at room temperature. The resulting mixture was then added to 15 liters ice-water over a 30 minute period while continuously stirring. The polymer precipitated from the aqueous medium and was isolated by filtration. The desired product was finally obtained by washing with water and subsequent drying at 45° C.

b) Second Modification Reaction on the First Modified Phenolic Polymer:

Diazonium Solution:

A mixture of 2.36 g AM-07, 30 ml 1-methoxy-2-propanol and 20 ml water was stirred and cooled to 5° C. Then 8,4 ml concentrated HCl was added and the mixture was cooled to 0° C. Then a solution of 1.52 g $NaNO_2$ in 4 ml water was added dropwise after which stirring was continued for another 15 minutes at 0° C.

First Modified Phenolic Polymer Solution:

A mixture of 30.2 g of the first modified phenolic polymer dissolved in 200 g 1-methoxy-2-propanol and 20.4 g $NaOAc.3H_2O$ was stirred and cooled to 0° C.

The above prepared diazonium solution was added dropwise to the first modified phenolic polymer solution over a 30 minute period after which stirring was continued for 30 minutes at 0° C. and 2 hours at room temperature. 200 ml acetone was added to the reaction mixture which was then being filtered. The filtrate was then added to 3 liters ice-water over a 60 minute period while continuously stirring. The polymer precipitated from the aqueous medium and was isolated by filtration. The desired product was finally obtained by washing with water and subsequent drying at 45° C.

Preparation of Polymer MP-29

Diazonium Solution:

A mixture of 13.9 g AM-01, 5.9 g AM-07, 200 ml 1-methoxy-2-propanol and 100 ml water was stirred and cooled to 5° C. Then 41 ml concentrated HCl was added and the mixture was cooled to 0° C. Then a solution of 7.6 g $NaNO_2$ in 20 ml water was added dropwise after which stirring was continued for another 30 minutes at 0° C.

Phenolic Polymer Solution:

A mixture of 153 g POL-01 solution (40% by weight), 102 g $NaOAc.3H_2O$ and 200 ml 1-methoxy-2-propanol was stirred and cooled to 0° C.

The above prepared diazonium solution was added dropwise to the phenolic polymer solution over a 60 minute period after which stirring was continued for 30 minutes at 0° C. and 2 hours at room temperature. The resulting mixture was then added to 5 liters ice-water over a 60 minute period while continuously stirring. The polymer precipitated from the aqueous medium and was isolated by filtration. The desired product was finally obtained by washing with water and subsequent drying at 45° C.

Test 1:

Preparation of the Coating:

A coating solution was prepared by mixing the following ingredients:

86.55 g Dowanol PM 464.64 g methyl ethyl ketone 101.28 g of a solution of the infrared dye IR-1 in a concentration of 2% by weight in Dowanol PM 144.70 g of a solution of the contrast dye CD-1 in a concentration of 1% by weight in Dowanol PM 159.14 g of a solution of Tego Glide 410 in a concentration of 1% by weight in Dowanol PM 159.14 g of a solution of a phenolic polymer, as listed in tables 1 to 4, in a concentration of 40% by weight in Dowanol PM 3.18 g of 3,4,5-trimethoxycinnamic acid.

The coating solution was coated on an electrochemically grained and anodized aluminum substrate at a wet thickness of 20 μm. The coating was dried for 1 minute at 130° C.

For measuring the chemical resistance 3 different solutions were selected:

Test solution 1: solution of isopropanol in a concentration of 50% by weight in water, Test solution 2: EMERALD PREMIUM MXEH, commercially available from ANCHOR, Test solution 3: ANCHOR AQUA AYDE, commercially available from ANCHOR.

The chemical resistance was tested by contacting a droplet of 40 μl of a test solution on different spots of the coating. After 3 minutes, the droplet was removed from the coating with a cotton pad. The attack on the coating due to each test solution was rated by visual inspection as follows:

0: no attack,
1: changed gloss of the coating's surface,
2: small attack of the coating (thickness is decreased),
3: heavy attack of the coating,
4: completely dissolved coating.

The higher the rating, the less is the chemical resistance of the coating. The results for the test solutions on each coating are summarized in Tables 1 to 4. The Tables also contain information about the type of the phenolic polymer used in the modification reaction, the type of modification reagens and the degree of modifications (in mol %) and the MP-number of the prepared polymer.

TABLE 1

| Example number | Type Phenolic Polymer | Type reagens | Degree modif. (mol %) | Prep. Polym. MP-nr. | TEST 1 Test solution 1 | TEST 1 Test solu-tion 2 |
|---|---|---|---|---|---|---|
| Comparative example 1 | POL-01 | — | — | — | 4 | 4 |
| Example 1 | POL-01 | AM-01 | 2.5 | MP-01 | 3 | 3 |
| Example 2 | POL-01 | AM-01 | 5 | MP-02 | 2 | 2 |
| Example 3 | POL-01 | AM-01 | 10 | MP-03 | 2 | 2 |
| Example 4 | POL-01 | AM-01 | 25 | MP-04 | 1 | 1 |
| Example 5 | POL-01 | AM-01 | 40 | MP-05 | 1 | 1 |
| Example 6 | POL-01 | AM-03 | 25 | MP-06 | 1 | 1 |

The Examples in Table 1 demonstrate that these polymers, modified according to the present invention, give rise to a significant increase of the chemical resistance of the coating compared with the unmodified polymer.

TABLE 2

| Example number | Type Phenolic Polymer | Type reagens | Degree modif. (mol %) | Prep. Polym. MP-nr. | TEST 1 Test solution 1 | TEST 1 Test solution 2 |
|---|---|---|---|---|---|---|
| Comparative example 2 | POL-04 | — | — | — | 4 | 4 |
| Example 7 | POL-04 | AM-01 | 25 | MP-07 | 2 | 1 |
| Comparative example 3 | POL-05 | — | — | — | 4 | 4 |
| Example 8 | POL-05 | AM-01 | 25 | MP-08 | 2 | 1 |
| Comparative example 4 | POL-06 | — | — | — | 4 | 4 |
| Example 9 | POL-06 | AM-01 | 25 | MP-09 | 2 | 1 |
| Comparative example 5 | POL-07 | — | — | — | 4 | 4 |
| Example 10 | POL-07 | AM-01 | 25 | MP-10 | 2 | 1 |
| Comparative example 6 | POL-08 | — | — | — | 4 | 4 |
| Example 11 | POL-08 | AM-01 | 25 | MP-11 | 2 | 1 |
| Comparative example 7 | POL-09 | — | — | — | 4 | 4 |
| Example 12 | POL-09 | AM-01 | 25 | MP-12 | 2 | 2 |
| Comparative example 8 | POL-10 | — | — | — | 4 | 4 |
| Example 13 | POL-10 | AM-01 | 25 | MP-13 | 2 | 1 |
| Comparative example 9 | POL-11 | — | — | — | 4 | 4 |
| Example 14 | POL-11 | AM-01 | 25 | MP-14 | 2 | 1 |

The Examples in Table 2 demonstrate that other polymers, modified according to the present invention, give rise to a significant increase of the chemical resistance of the coating compared with the unmodified polymers.

TABLE 3

| Example number | Type Phenolic Polymer | Type reagens | Degree modif. (mol %) | Prep. Polym. MP-nr. | TEST 1 Test solu-tion 1 | TEST 1 Test solu-tion 3 |
|---|---|---|---|---|---|---|
| Comparative example 10 | POL-01 | — | — | — | 4 | 4 |
| Example 15 | POL-01 | AM-07 | 25 | MP-15 | 1 | 2 |
| Example 16 | POL-01 | AM-07 | 40 | MP-16 | 0 | 1 |
| Comparative example 11 | POL-02 | — | — | — | 4 | 4 |
| Example 17 | POL-02 | AM-07 | 10 | MP-17 | 3 | 3 |
| Example 18 | POL-02 | AM-07 | 25 | MP-18 | 1 | 1 |
| Example 19 | POL-01 | AM-08 | 25 | MP-19 | 2 | 3 |
| Example 20 | POL-01 | AM-10 | 25 | MP-20 | 1 | 1 |

The Examples in Table 3 demonstrate that these polymers, modified according to the present invention with different types of azo-aryl groups in different amounts, give rise to a significant increase of the chemical resistance of the coating.

TABLE 4

| Example number | Type Phenolic Polymer | Type reagens | Degree modif. (mol %) | Prep. Polym. MP-nr. | TEST 1 Test solu-tion 1 | TEST 1 Test solu-tion 3 |
|---|---|---|---|---|---|---|
| Example 26 | POL-01 | AM-01 + AM-07 | 10 10 | MP-28 | 1 | 2 |
| Example 27 | POL-01 | Mixture AM-01 + AM-07 | 10 10 | MP-29 | 1 | 2 |

The Examples in Table 4 demonstrate that these polymers, modified according to the present invention with a combination of 2 different types of azo-aryl groups, give rise to a significant increase of the chemical resistance of the coating.

Test 2:

Preparation of the Coating:

A coating solution was prepared by mixing the following ingredients:

313.45 g Dowanol PM 482.40 g methyl ethyl ketone 50.64 g of a solution of the infrared dye IR-1 in a concentration of 2% by weight in Dowanol PM 72.35 g of a solution of the contrast dye CD-1 in a concentration of 1% by weight in Dowanol PM 79.57 g of a solution of a phenolic polymer, as listed in Table 5, in a concentration of 40% by weight in Dowanol PM 1.59 g of 3,4,5-trimethoxycinnamic acid.

Half of the surface of an electrochemically grained and anodized aluminum substrate was coated with the above prepared solution at a wet thickness of 10 μm. The sample was dried for 1 minute at 130° C. and gummed with OZASOL RC515, commercially available from AGFA, in order to protect the non-coated part of the aluminum.

Printing:

The plate was mounted on a “ABDick 360” press using “K+E 800 Skinnex Black”, commercially available from BASF, as ink and “Emerald Premium MXEH”, commercially available from ANCHOR, as fountain. The run length was determined based on the maximum number of prints that could be printed without any significant sign of wear on the printing area. The run length test was stopped at 100 000 copies. The run lengths are summarized in Table 5. Table 5 also contains information about the type of the phenolic polymer used in the modification reaction, the type of modification reagens, the degree of modifications (in mol %) and the MP-number of prepared polymer.

TABLE 5

| Example number | Type Phenolic Polymer | Type reagens | Degree modif. (mol %) | Prep. Polym. MP-nr. | TEST 2 Printing Run Length |
|---|---|---|---|---|---|
| Comparative example 12 | POL-01 | — | — | — | 25 000 |
| Example 28 | POL-01 | AM-01 | 2.5 | MP-01 | 43 000 |
| Example 29 | POL-01 | AM-01 | 5 | MP-02 | 45 000 |
| Example 30 | POL-01 | AM-01 | 10 | MP-03 | 75 000 |
| Example 31 | POL-01 | AM-01 | 25 | MP-04 | 73 000 |
| Example 32 | POL-01 | AM-01 | 40 | MP-05 | 64 000 |
| Example 33 | POL-01 | AM-10 | 25 | MP-20 | >100 000 |

The Examples in Table 5 demonstrate that these polymers, modified according to the present invention, give rise to a significant increase of the printing run length of the coating compared with the unmodified polymer.

Test 3:

Preparation of the Coating:

A coating solution was prepared by mixing the following ingredients:

209.1 g tetrahydrofuran 105 g of a solution of a phenolic polymer, as listed in table 6, in a concentration of 40% by weight in Dowanol PM 327 g Dowanol PM 266 g methyl ethyl ketone 1.51 g of the infrared dye IR-1-

54 g of a solution of Basonyl Blue 640, commercially available from BASF, added as a solution of 1% by weight in Dowanol PM 32.4 g of a solution of Tego Glide 410 in a concentration of 1% by weight in Dowanol PM. (Remark: 8.5 g instead of 32.4 g of that solution used in Example 39.)

an amount in g of 3,4,5-trimethoxycinnamic acid, referred to below as TMCA, as listed in table 6.

The coating solution was coated on an electrochemically grained and anodized aluminum substrate at a wet thickness of 26 μm on a coating line at a speed of 8 m/min using a drying temperature of 130° C.

Exposure:

The printing plate precursors were exposed on a CreoScitex Trendsetter 3244 at the energy density (in $mJ/cm^2$) listed in Table 6.

Processing:

The imagewise exposed printing plate precursors were processed in an Agfa Autolith T processor, operating at a speed of 0.96 m/min and at 25° C., and using Agfa TD5000 as developer and RC795, commercially available from AGFA, as gum.

Printing:

The processed plates were used as a print master on a Sakurai Oliver 52 printing press using K+E 800 Skinnex Black, commercially available from BASF, as ink and 4% Emerald Premium MXEH as fountain solution. The plates were printed up to 100 000 (or 100K) prints and the run length was determined as indicated in Table 6.

TABLE 6

| Example number | Type Phenolic Polymer | Type reagens | Degree modif. (mol %) | Prep. Polym. MP-nr. | TMCA (g) | Exposure value ($mJ/cm^2$) | TEST 3 Run length |
|---|---|---|---|---|---|---|---|
| Comparative example 13 | POL-01 | — | — | — | 5.40 | 160 | 50K |
| Example 36 | POL-01 | AM-01 | 5 | MP-02 | 1.95 | 300 | >100K |
| Example 37 | POL-01 | AM-10 | 5 | MP-23 | 4.32 | 232 | >100K |
| Example 38 | POL-01 | AM-10 | 10 | MP-22 | 4.11 | 264 | >100K |
| Example 39 | POL-01 | AM-10 | 20 | MP-21 | 5.30 | 291 | >100K |

The Examples in Table 6 demonstrate that these polymers, modified according to the present invention, give rise to a significant increase of the printing run length of the printing plate.

Test 4:

Preparation of the Coating:

The same materials were used as described in Test 3.

The percentage of the weight loss of the coating was tested on a sample of 10×10 cm of each of the above described printing plate precursors by the following procedure:

- the weight "A" was measured of each sample;
- these samples were immersed during 3 minutes in the Test solution 1 of Test 1, subsequently rinsed with water and dried;
- the weight "B" was measured of each sample;
- the heat-sensitive coating of each sample was removed by dissolving with methyl-ethyl-ketone (if the coating was not fully removed, other appropriate solvents can be used such as acetone, tetrahydrofuran, Dowanol PM, methanol or butyrolactone);
- these samples were rinsed with water and dried;
- the weight "C" was measured of each sample;
- the percentage of the weight loss of each sample was calculated by the following formula:

$$(A-B)\times100\%/(A-C)$$

The results are summarized in Table 7.

TABLE 7

| Example number | Type of material: the same as | Weight "A" | Weight "B" | Weight "C" | TEST 4 percentage weight loss |
|---|---|---|---|---|---|
| Comparative example 14 | Comparative example 13 | 7.5276 | 7.5222 | 7.5165 | 49 |
| Example 40 | Example 36 | 7.3785 | 7.3785 | 7.3683 | 0 |
| Example 41 | Example 37 | 7.3169 | 7.3163 | 7.3064 | 6 |
| Example 42 | Example 38 | 7.3655 | 7.3647 | 7.3548 | 7 |
| Example 43 | Example 39 | 7.3816 | 7.3813 | 7.3720 | 3 |

The Examples in Table 7 demonstrate that printing plate precursors which comprise in their coating one of these polymers, modified according to the present invention with different types of azo-aryl groups in different amounts, give rise to a very low percentage of weight loss of the coating, indicating that the chemical resistance is significantly increased. All the other Examples 1 to 39 also showed a weight loss lower than 45%.

Test 5:

Preparation of the Coating:

The Comparative Example 15 and the Invention Example 44 were prepared in the same way as Comparative Example 13 and Example 39 as described in Test 3 and as indicated in Table 6.

The chemical resistance was measured in the same way as in Test 1 with the exception that Test solution 4 and Test solution 5 were used instead of Test solution 1, 2 or 3:

- Test solution 4: METER-X is a metering and dampening roller cleaner, commercially available from ABC CHEMICAL CORP. LTD.
- Test solution 5: WASH R-228 is a roller and blanket cleaner, commercially available from ANCHOR.

For the evaluation the same rating was used as in Test 1 and the results are summarized in Table 8.

TABLE 8

| Example number | Type of material: the same as | Test 5 Test solution 4 | Test 5 Test solution 5 |
|---|---|---|---|
| Comparative example 15 | Comparative example 13 | 4 | 2 |
| Example 44 | Example 39 | 2 | 1 |

Example 44 in Table 8 demonstrate that a coating, based on a polymer which is modified according to the present invention, give rise to a significant increase of the chemical resistance against press chemicals.

Test 6:

Preparation of the Coating:

A coating solution was prepared by mixing the following ingredients:

- 10.12 g tetrahydrofuran
- 5.54 g of a solution of a phenolic polymer, as listed in table 9, in a concentration of 40% by weight in Dowanol PM
- 19.7 g Dowanol PM
- 12.9 g methyl ethyl ketone
- 0.12 g of the infrared dye IR-1
- 1.16 g of Cymel 303, commercially available from DYNO CYTEC
- 0.3 g 3,4,5-trimethoxycinnamic acid.

The coating solution was coated on an electrochemically grained and anodized aluminum substrate at a wet thickness of 16 μm. The coating was dried for 5 minutes at 90° C.

Exposure and Pre-heating:

The printing plate precursors were exposed on a CreoScitex Trendsetter 3244 at an exposure energy of 300 mJ/cm$^2$. Next the printing plate precursors were heated for 1 minute at 110° C.

Processing:

The imagewise exposed and preheated printing plate precursors were processed with New Unidev, commercially available from AGFA, as developer, thereby removing the non-image areas. After rinsing with water the final printing plate was obtained.

For measuring the chemical resistance the same test procedure as indicated in Test 1 was used. The results for the test solutions on each coating are summarized in table 9 wherein also information about the type of the phenolic polymer used in the modification is reaction, the type of modification reagens, the degree of modifications (in mol %) and the MP-number of prepared polymer are given.

TABLE 9

| Example number | Type Phenolic Polymer | Type reagens | Degree modif. (mol %) | Prep. Polym. MP-nr. | TEST 6 Test solution 2 | TEST 6 Test solution 3 |
|---|---|---|---|---|---|---|
| Comparative example 16 | POL-01 | — | — | — | 4 | 2 |
| Example 45 | POL-01 | AM-10 | 20 | MP-21 | 0 | 0 |
| Example 46 | POL-01 | AM-10 | 25 | MP-20 | 1 | 0 |

Remark: The lower value of the chemical resistance for this negative-working Comparative example 16 is explained by the fact that the image areas of this negative-working plate are crosslinked which is not the case in the positive-working examples.

The Examples 45 and 46 in Table 9 demonstrate that negative-working coatings comprising the polymers, modified according to the present invention, give rise to a significant increase of the chemical resistance.

The invention claimed is:

1. A heat-sensitive lithographic printing plate precursor comprising a support having a hydrophilic surface and an oleophilic coating provided on the hydrophilic surface, said coating comprising an infrared light absorbing agent, and a polymer which comprises a phenolic monomeric unit, wherein the phenyl group of the phenolic monomeric unit is substituted by a group having the structure —N═N-Q, wherein the —N═N— group is covalently bound to a carbon atom of the phenyl group, and wherein Q is an aromatic group.

2. The lithographic printing plate precursor according to claim 1 wherein Q is a group comprising at least one heteroatom.

3. The lithographic printing plate precursor according to claim 2 wherein said heteroatom is a nitrogen, an oxygen or a sulfur atom.

4. The lithographic printing plate precursor according to claim 1 wherein Q has the structure $-A-(T)_n$ wherein A is a mono-cyclic 5- or 6-membered aromatic group or a 5- or 6-membered aromatic ring annelated with another ring system, wherein n is an integer selected between 0 and the maximum available positions on the aromatic group A, wherein each T group is selected from $—SO_2—NH—R^1$, $—NH—SO_2—R^4$, $—CO—NR^1—R^2$, $—NR^1—CO—R^4$, $—NR^1—CO—NR^2—R^3$, $—NR^1—CS—NR^2—R^3$, $—NR^1—CO—O—R^1$, $—O—CO—NR^1—R^2$, $—O—CO—R^4$, $—CO—O—R^4$, $—CO—R^3$, $—SO_3—R^1$, $—O—SO_2—R^4$, $—SO_2—R^1$, $—SO—R^4$, $—P(═O)(—O—R^1)(—O—R^2)$, $—O—P(═O)(—O—R^1)(—O—R^2)$, $—NR^1—R^2$, $—O—R^2$, $—S—R^2$, $—N═N—R^4$, —CN, $—NO_2$, a halogenide and $-M-R^1$, wherein M represents a divalent linking group containing 1 to 8 carbon atoms, wherein $R^1$, $R^2$ and $R^3$ are each independently selected from hydrogen and an optionally substituted alkyl, alkenyl, alkynyl, cycloalkyl, heterocyclic, aryl, heteroaryl, aralkyl or heteroaralkyl group, wherein $R^4$ and $R^5$ are selected from optionally substituted alkyl, alkenyl, alkynyl, cycloalkyl, heterocyclic, aryl, heteroaryl, aralkyl and heteroaralkyl groups, or wherein at least two groups selected from each $R^1$ to $R^5$ together represent the necessary atoms to form a cyclic structure.

5. The lithographic printing plate precursor according to claim 1 wherein the —N═N-Q group comprises the following formula

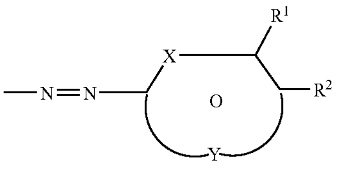

wherein X is $CR^3$, $NR^4$ or N, wherein Y denotes the necessary atoms to form a 5- or 6-membered aromatic ring, said atoms being selected from the group consisting of $CR^3$, $NR^4$, N, S and O, wherein each $R^1$, $R^2$ and $R^3$ is selected from hydrogen, an optionally substituted alkyl, alkenyl, alkynyl, cycloalkyl, heterocyclic, aryl, heteroaryl, aralkyl or heteroaralkyl group, $—SO_2—NH—R^5$, $—NH—SO_2—R^7$, $—CO—NR^5—R^6$, $—NR^5—CO—R^7$, $—O—CO—R^7$, $—CO—O—R^5$, $—CO—R^5$, $—SO_3—R^5$, $—SO_2—R^5$, $—SO—R^7$, $—P(═O)(—O—R^5)(—O—R^6)$, $—NR^5—R^6$, $—O—R^5$, $—S—R^5$, —CN, $—NO_2$, halogen and $-M-R^5$, wherein M represents a divalent linking group containing 1 to 8 carbon atoms, wherein $R^4$, $R^5$ and $R^6$ are independently selected from hydrogen and an optionally substituted alkyl, alkenyl, alkynyl, cycloalkyl, heterocyclic, aryl, heteroaryl, aralkyl or heteroaralkyl group, wherein $R^7$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^7$ together represent the necessary atoms to form a cyclic structure.

6. The lithographic printing plate precursor according to claim 1 wherein the —N═N-Q group comprises the following formula

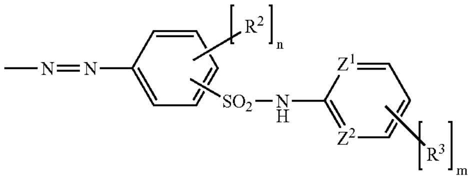

wherein $Z^1$ and $Z^2$ are independently selected from $CR^1$ and N, wherein $R^1$ is selected from hydrogen and an optionally substituted alkyl, alkenyl, alkynyl, cycloalkyl, heterocyclic, aryl, heteroaryl, aralkyl or heteroaralkyl group, wherein n is 0, 1, 2, 3 or 4, wherein m is 0, 1, 2 or 3, wherein $R^2$ and $R^3$ are independently selected from hydrogen, an optionally substituted alkyl, alkenyl, alkynyl, cycloalkyl, heterocyclic, aryl, heteroaryl, aralkyl or heteroaralkyl group, $—SO_2—NH—R^4$, $—NH—SO_2—R^6$, $—CO—NR^4—R^5$, $—NR^4—CO—R^6$, $—O—CO—R^6$, $—CO—O—R^4$, $—CO—R^4$, $—SO_3—R^4$, $—SO_2—R^4$, $—SO—R^6$, $—P(═O)(—O—R^4)(—O—R^5)$, $—NR^4—R^5$, $—O—R^4$, $—S—R^4$, —CN, $—NO_2$, halogen and $-M-R^4$, wherein M represents a divalent linking group containing 1 to 8 carbon atoms, wherein $R^4$ and $R^5$ are independently selected from hydrogen and an optionally substituted alkyl, alkenyl, alkynyl, cycloalkyl, heterocyclic, aryl, heteroaryl, aralkyl or heteroaralkyl group, wherein $R^6$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^6$ together represent the necessary atoms to form a cyclic structure.

7. The lithographic printing plate precursor according to claim 1 wherein the —N═N-Q group comprises the following formula

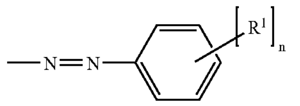

wherein n is 0, 1, 2, 3, 4, or 5, wherein each $R^1$ is selected from hydrogen, an optionally substituted alkyl, alkenyl, alkynyl, cycloalkyl, heterocyclic, aryl, heteroaryl, aralkyl or heteroaralkyl group, $—SO_2—NH—R^2$, $—NH—SO_2—R^4$, $—CO—NR^2—R^3$, $—NR^2—CO$-4, $—O—CO—R^4$, $—CO—O—R^2$, $—CO—R^2$, $—SO_3—R^2$, $—SO^2—R^2$, $—SO—R^4$, $—P(=O)(—O—R^2)(—O—R^3)$, $—NR^2—R^3$, $—O—R^2$, $—S—R^2$, —CN, $—NO_2$, a halogen and -M-$R^2$, wherein M represents a divalent linking group containing 1 to 8 carbon atoms, wherein $R^2$ and $R^3$ are independently selected from hydrogen and an optionally substituted alkyl, alkenyl, alkynyl, cycloalkyl, heterocyclic, aryl, heteroaryl, aralkyl or heteroaralkyl group, wherein $R^4$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^4$ together represent the necessary atoms to form a cyclic structure.

8. The lithographic printing plate precursor according to claim 1 wherein the —N═N-Q group comprises the following formula

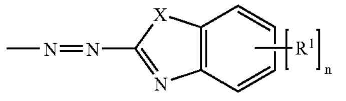

wherein n is 0, 1, 2, 3 or 4, wherein each $R^1$ is selected from hydrogen, an optionally substituted alkyl, alkenyl, alkynyl, cycloalkyl, heterocyclic, aryl, heteroaryl, aralkyl or heteroaralkyl group, $—SO_2—NH—R^2$, $—NH—SO_2—R^4$, $—CO—NR^2—R^3$, $—NR^2—CO—R^4$, $—O—CO—R^4$, $—CO—O—R^2$, $—CO—R^2$, $—SO_3—R^2$, $—SO_2—R^2$, $—SO—R^4$, $—P(=O)(—O—R^2)(—O—R^3)$, $—NR^2—R^3$, $—O—R^2$, $—S—R^2$, —CN, $—NO_2$, a halogen and -M-$R^2$, wherein M represents a divalent linking group containing 1 to 8 carbon atoms, wherein X is O, S or $NR^5$, wherein $R^2$, $R^3$ and $R^5$ are independently selected from hydrogen and an optionally substituted alkyl, alkenyl, alkynyl, cycloalkyl, heterocyclic, aryl, heteroaryl, aralkyl or heteroaralkyl group, wherein $R^4$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^5$ together represent the necessary atoms to form a cyclic structure.

9. The lithographic printing plate precursor according to claim 1 wherein the —N═N-Q group comprises the following formula

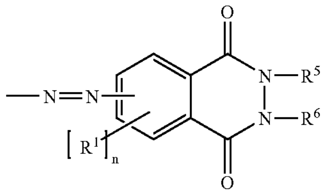

wherein n is 0, 1, 2 or 3, wherein each $R^1$ is selected from hydrogen, an optionally substituted alkyl, alkenyl, alkynyl, cycloalkyl, heterocyclic, aryl, heteroaryl, aralkyl or heteroaralkyl group, $—SO_2—NH—R^2$, $—NH—SO_2—R^4$, $—CO—NR^2—R^3$, $—NR^2—CO—R^4$, $—O—CO—R^4$, $—CO—O—R^2$, $—CO—R^2$, $—SO_3—R^2$, $—SO_2—R^2$, $—SO—R^4$, $—P(=O)(—O—R^2)(—O—R^3)$, $—NR^2—R^3$, $—O—R^2$, $—S—R^2$, —CN, $—NO_2$, a halogen and -M-$R^2$, wherein M represents a divalent linking group containing 1 to 8 carbon atoms, wherein $R^2$, $R^3$, $R^5$ and $R^6$ are independently selected from hydrogen and an optionally substituted alkyl, alkenyl, alkynyl, cycloalkyl, heterocyclic, aryl, heteroaryl, aralkyl or heteroaralkyl group, wherein $R^4$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^4$ together represent the necessary atoms to form a cyclic structure, or wherein $R^5$ and $R^6$ together represent the necessary atoms to form a cyclic structure.

10. The lithographic printing plate precursor according to claim 1 wherein the —N═N-Q group comprises the following formula

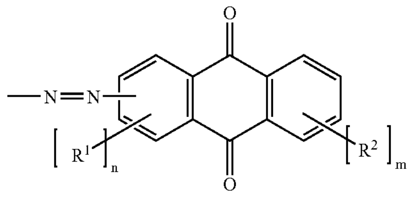

wherein n is 0, 1, 2 or 3, wherein m is 0, 1, 2, 3 or 4, 3 wherein each $R^1$ and $R^2$ are independently selected from hydrogen, an optionally substituted alkyl, alkenyl, alkynyl, cycloalkyl, heterocyclic, aryl, heteroaryl, aralkyl or heteroaralkyl group, $—SO_2—NH—R^3$, $—NH—SO_2—R^5$, $—CO—NR^3—R^4$, $—NR^3—CO—R^5$, $—O—CO—R^5$, $—CO—O—R^3$, $—CO—R^3$, $—SO_3—R^3$, $—SO_2—R^3$, $—SO—R^5$, $—P(=O)(—O—R^3)(—O—R^4)$, $—NR^3—R^4$, $—O—R^3$, $—S—R^3$, —CN, $—NO_2$, a halogen and -M-$R^3$, wherein M represents a divalent linking group containing 1 to 8 carbon atoms, wherein $R^3$ and $R^4$ are independently selected from hydrogen and an optionally substituted alkyl, alkenyl, alkynyl, cycloalkyl, heterocyclic, aryl, heteroaryl, aralkyl or heteroaralkyl group, wherein $R^5$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^5$ together represent the necessary atoms to form a cyclic structure.

11. The lithographic printing plate precursor according to claim 1 wherein the —N═N-Q group comprises the following formula

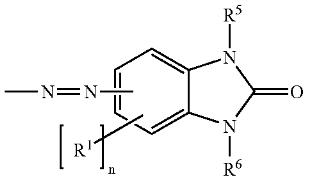

wherein n is 0, 1, 2 or 3, wherein each $R^1$ is selected from hydrogen, an optionally substituted alkyl, alkenyl, alkynyl, cycloalkyl, heterocyclic, aryl, heteroaryl, aralkyl or heteroaralkyl group, —$SO_2$—NH—$R^2$, —NH—$SO_2$—$R^4$, —CO—$NR^2$—$R^3$, —$NR^2$—CO—$R^4$, —O—CO—$R^4$, —CO—O—$R^2$, —CO—$R^2$, —$SO_3$—$R^2$, —$SO_2$—$R^2$, —SO—$R^4$, —P(═O)(—O—$R^2$)(—O—$R^3$), —$NR^2$—$R^3$, —O—$R^2$, —S—$R^2$, —CN, —$NO_2$, a halogen and -M-$R^2$, wherein M represents a divalent linking group containing 1 to 8 carbon atoms, wherein $R^2$, $R^3$, $R^5$ and $R^6$ are independently selected from hydrogen and an optionally substituted alkyl, alkenyl, alkynyl, cycloalkyl, heterocyclic, aryl, heteroaryl, aralkyl or heteroaralkyl group, wherein $R^4$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^6$ together represent the necessary atoms to form a cyclic structure.

12. The lithographic printing plate precursor according to claim 1 wherein the —N═N-Q group comprises one of the following formulae:

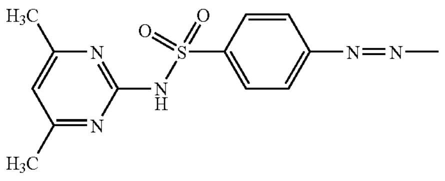

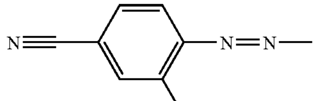

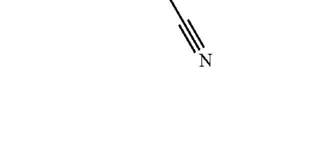

-continued

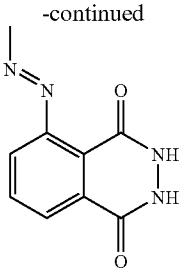

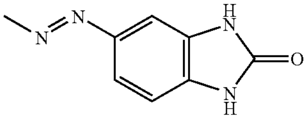

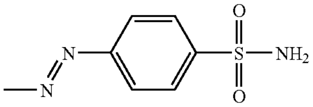

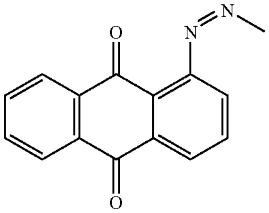

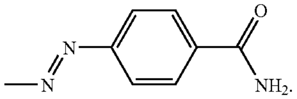

13. The lithographic printing plate precursor according to claim 1, wherein said polymer comprising a phenolic monomeric unit is a novolac, resol or polyvinylphenol.

14. The lithographic printing plate precursor according to claim 1, wherein said coating further comprises a dissolution inhibitor and wherein said precursor is a positive working lithographic printing plate precursor.

15. The lithographic printing plate precursor according to claim 14, wherein said dissolution inhibitor is selected from the group consisting of an organic compound which comprises at least one aromatic group and a hydrogen bonding site, a polymer or surfactant comprising siloxane or perfluoroalkyl units, and mixtures thereof.

16. The lithographic printing plate precursor according to claim 1, wherein said coating further comprising a latent Brönsted acid and an acid-crosslinkable compound and wherein said precursor is a negative working lithographic printing plate precursor.

17. The lithographic printing plate precursor according to claim 2 wherein Q has the structure -A-$(T)_n$ wherein A is a mono-cyclic 5- or 6-membered aromatic group or a 5- or 6-membered aromatic ring annelated with another ring system, wherein n is an integer selected between 0 and the maximum available positions on the aromatic group A, wherein each T group is selected from —$SO_2$—NH—$R^1$, —NH—$SO_2$—$R^4$, —CO—$NR^1$—$R^2$, —$NR^1$—CO—$R^4$, —$NR^1$—CO—$NR^2$—$R^3$, —$NR^1$—CS—$NR^1$—$R^3$, —$NR^1$—CO—O—$R^1$, —O—CO—$NR^1$—$R^2$, —O—CO—$R^4$, —CO—O—$R^4$, —CO—$R^4$, —$SO_3$—$R^1$, —O—$SO_2$—$R^4$, —$SO_2$—$R^1$, —SO—$R^4$, —P(═O)(—O—$R^1$)(—O—$R^2$), —O—P(═O)(—O—

$R^1$)(—O—$R^2$), —$NR^1$—$R^2$, —O—$R^2$, —S—$R^2$, —N═N—$R^4$, —CN, —$NO_2$, a halogenide and -M-$R^1$, wherein M represents a divalent linking group containing 1 to 8 carbon atoms, wherein $R^1$, $R^2$ and $R^3$ are each independently selected from hydrogen and an optionally substituted alkyl, alkenyl, alkynyl, cycloalkyl, heterocyclic, aryl, heteroaryl, aralkyl or heteroaralkyl group, wherein $R^4$ and $R^5$ are selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^5$ together represent the necessary atoms to form a cyclic structure.

18. The lithographic printing plate precursor according to claim 3 wherein Q has the structure -A-$(T)_n$ wherein A is a mono-cyclic 5- or 6-membered aromatic group or a 5- or 6-membered aromatic ring annelated with another ring system, wherein n is an integer selected between 0 and the maximum available positions on the aromatic group A, wherein each T group is selected from —$SO_2$—NH—$R^1$, —NH—$SO_2$—$R^4$, —CO—$NR^1$—$R^2$, —$NR^1$—CO—$R^4$, —$NR^1$—CO—$NR^2$—$R^3$, —$NR^1$—CS—$NR^2$—$R^3$, —$NR^1$—CO—O—$R^1$, —O—CO—$NR^1$—$R^2$, —O—CO—$R^4$, —CO—O—$R^4$, —CO—$R^4$, —$SO_3$—$R^1$, —O—$SO_2$—$R^1$, —$SO_2$—$R^4$, —SO—$R^4$, —P(═O)(—O—$R^1$)(—O—$R^2$), —O—P(═O)(—O—$R^1$)(—O—$R^2$), —$NR^1$—$R^2$, —O—$R^2$, —S—$R^2$, —N═N—$R^4$, —CN, —$NO_2$, a halogenide and -M-$R^1$, wherein M represents a divalent linking group containing 1 to 8 carbon atoms, wherein $R^1$, $R^2$ and $R^3$ are each independently selected from hydrogen and an optionally substituted alkyl, alkenyl, alkynyl, cycloalkyl, heterocyclic, aryl, heteroaryl, aralkyl or heteroaralkyl group, wherein $R^4$ and $R^5$ are selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^5$ together represent the necessary atoms to form a cyclic structure.

19. The lithographic printing plate precursor according to claim 2 wherein the —N═N-Q group comprises the following formula

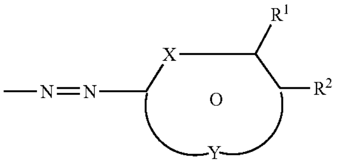

wherein X is $CR^3$, $NR^4$ or N, wherein Y denotes the necessary atoms to form a 5- or 6-membered aromatic ring, said atoms being selected from the group consisting of $CR^3$, $NR^4$, N, S and O, wherein each $R^1$, $R^2$ and $R^3$ is selected from hydrogen, an optionally substituted alkyl, alkenyl, alkynyl, cycloalkyl, heterocyclic, aryl, heteroaryl, aralkyl or heteroaralkyl group, —$SO_2$—NH—$R^5$, —NH—$SO_2$—$R^7$, —CO—$NR^5$—$R^6$, —$NR^5$—CO—$R^7$, —O—CO—$R^7$, —CO—O—$R^5$, —CO—$R^5$, —$SO_3$—$R^5$, —$SO_2$—$R^5$, —SO—$R^7$, —P(═O)(—O—$R^5$)(—O—$R^6$), —$NR^5$—$R^6$, —O—$R^5$, —S—$R^5$, —CN, —$NO_2$, halogen and -M-$R^5$, wherein M represents a divalent linking group containing 1 to 8 carbon atoms, wherein $R^4$, $R^5$ and $R^6$ are independently selected from hydrogen and an optionally substituted alkyl, alkenyl, alkynyl, cycloalkyl, heterocyclic, aryl, heteroaryl, aralkyl or heteroaralkyl group, wherein $R^7$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^7$ together represent the necessary atoms to form a cyclic structure.

20. The lithographic printing plate precursor according to claim 3 wherein the —N═N-Q group comprises the following formula

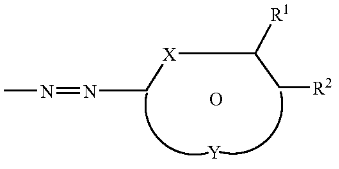

wherein X is $CR^3$, $NR^4$ or N, wherein Y denotes the necessary atoms to form a 5- or 6-membered aromatic ring, said atoms being selected from the group consisting of $CR^3$, $NR^4$, N, S and O, wherein each $R^1$, $R^2$ and $R^3$ is selected from hydrogen, an optionally substituted alkyl, alkenyl, alkynyl, cycloalkyl, heterocyclic, aryl, heteroaryl, aralkyl or heteroaralkyl group, —$SO_2$—NH—$R^5$, —NH—$SO_2$—$R^7$, —CO—$NR^5$—$R^6$, —$NR^5$—CO—$R^7$, —O—CO—$R^7$, —CO—O—$R^5$, —CO—$R^5$, —$SO_3$—$R^5$, —$SO_2$—$R^5$, —SO—$R^7$, —P(═O)(—O—$R^5$)(—O—$R^6$), —$NR^5$—$R^6$, —O—$R^5$, —S—$R^5$, —CN, —$NO_2$, halogen and -M-$R^5$, wherein M represents a divalent linking group containing 1 to 8 carbon atoms, wherein $R^4$, $R^5$ and $R^6$ are independently selected from hydrogen and an optionally substituted alkyl, alkenyl, alkynyl, cycloalkyl, heterocyclic, aryl, heteroaryl, aralkyl or heteroaralkyl group, wherein $R^7$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^7$ together represent the necessary atoms to form a cyclic structure.

21. The lithographic printing plate precursor according to claim 2 wherein the —N═N-Q group comprises the following formula

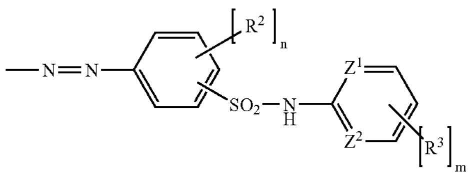

wherein $Z^1$ and $Z^2$ are independently selected from $CR^1$ or N, wherein $R^1$ is selected from hydrogen and an optionally substituted alkyl, alkenyl, alkynyl, cycloalkyl, heterocyclic, aryl, heteroaryl, aralkyl or heteroaralkyl group, wherein n is 0, 1, 2, 3 or 4, wherein m is 0, 1, 2 or 3, wherein $R^2$ and $R^3$ are independently selected from hydrogen, an optionally substituted alkyl, alkenyl, alkynyl, cycloalkyl, heterocyclic, aryl, heteroaryl, aralkyl or heteroaralkyl group, —$SO_2$—NH—$R^4$, —NH—$SO_2$—$R^6$, —CO—$NR^4$—$R^5$, —$NR^4$—CO—$R^6$, —O—CO—$R^6$, —CO—O—$R^4$, —CO—$R^4$, —$SO_3$—$R^4$, —$SO_2$—$R^4$, —SO—$R^6$, —P(═O)(—O—$R^4$)(—O—$R^5$), —$NR^4$—$R^5$, —O—$R^4$, —S—$R^4$, —CN, —$NO_2$, halogen, and -M-$R^4$, wherein M represents a divalent linking group containing 1 to 8 carbon atoms, wherein $R^4$ and $R^5$ are independently selected from hydrogen and an optionally substituted alkyl, alkenyl, alkynyl, cycloalkyl, heterocyclic, aryl, heteroaryl, aralkyl or heteroaralkyl group, wherein $R^6$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^6$ together represent the necessary atoms to form a cyclic structure.

22. The lithographic printing plate precursor according to claim 3 wherein the —N═N-Q group comprises the following formula

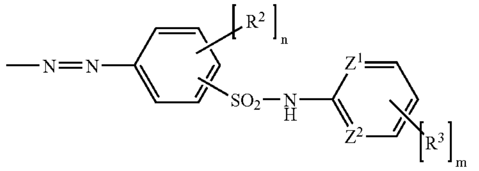

wherein $Z^1$ and $Z^2$ are independently selected from $CR^1$ and N, wherein $R^1$ is selected from hydrogen and an optionally substituted alkyl, alkenyl, alkynyl, cycloalkyl, heterocyclic, aryl, heteroaryl, aralkyl or heteroaralkyl group, wherein n is 0, 1, 2, 3 or 4, wherein m is 0, 1, 2 or 3, wherein $R^2$ and $R^3$ are independently selected from hydrogen, an optionally substituted alkyl, alkenyl, alkynyl, cycloalkyl, heterocyclic, aryl, heteroaryl, aralkyl or heteroaralkyl group, —$SO_2$—NH—$R^4$, —NH—$SO_2$—$R^6$, —CO—$NR^4$—$R^5$, —$NR^4$—CO—$R^6$, —O—CO—$R^6$, —CO—O—$R^4$, —CO—$R^4$, —$SO_3$—$R^4$, —$SO_2$—$R^4$, —SO—$R^6$, —P(═O)(—O—$R^4$)(—O—$R^5$), —$NR^4$—$R^5$, —O—$R^4$, —S—$R^4$, —CN, —$NO_2$, halogen and -M-$R^4$, wherein M represents a divalent linking group containing 1 to 8 carbon atoms, wherein $R^4$ and $R^5$ are independently selected from hydrogen and an optionally substituted alkyl, alkenyl, alkynyl, cycloalkyl, heterocyclic, aryl, heteroaryl, aralkyl or heteroaralkyl group, wherein $R^6$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^6$ together represent the necessary atoms to form a cyclic structure.

23. The lithographic printing plate precursor according to claim 2 wherein the —N═N-Q group comprises the following formula

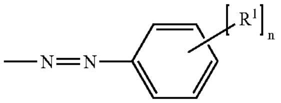

wherein n is 0, 1, 2, 3, 4, or 5, wherein each $R^1$ is selected from hydrogen, an optionally substituted alkyl, alkenyl, alkynyl, cycloalkyl, heterocyclic, aryl, heteroaryl, aralkyl or heteroaralkyl group, —$SO_2$—NH—$R^2$, —NH—$SO_2$—$R^4$, —CO—$NR^2$—$R^3$, —$NR^2$—CO—$R^4$, —O—CO—$R^4$, —CO—O—$R^2$, —CO—$R^2$, —$SO_3$—$R^2$, —$SO_2$—$R^2$, —SO—$R^4$, —P(═O)(—O—$R^2$)(—O—$R^3$), —$NR^2$—$R^3$, —O—$R^2$, —S—$R^2$, —CN, —$NO_2$, a halogen and -M-$R^2$, wherein M represents a divalent linking group containing 1 to 8 carbon atoms, wherein $R^2$ and $R^3$ are independently selected from hydrogen and an optionally substituted alkyl, alkenyl, alkynyl, cycloalkyl, heterocyclic, aryl, heteroaryl, aralkyl or heteroaralkyl group, wherein $R^4$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^4$ together represent the necessary atoms to form a cyclic structure.

24. The lithographic printing plate precursor according to claim 3 wherein the —N═N-Q group comprises the following formula

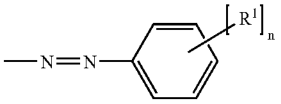

wherein n is 0, 1, 2, 3, 4, or 5, wherein each $R^1$ is selected from hydrogen, an optionally substituted alkyl, alkenyl, alkynyl, cycloalkyl, heterocyclic, aryl, heteroaryl, aralkyl or heteroaralkyl group, —$SO_2$—NH—$R^2$, —NH—$SO_2$—$R^4$, —CO—$NR^2$—$R^3$, —$NR^2$—CO—$R^4$, —O—CO—$R^4$, —CO—O—$R^2$, —CO—$R^2$, —$SO_3$—$R^2$, —$SO_2$—$R^2$, —SO—$R^4$, —P(═O)(—O—$R^2$)(—O—$R^3$), —$NR^2$—$R^3$, —O—$R^2$, —S—$R^2$, —CN, —$NO_2$, a halogen and -M-$R^2$, wherein M represents a divalent linking group containing 1 to 8 carbon atoms, wherein $R^2$ and $R^3$ are independently selected from hydrogen and an optionally substituted alkyl, alkenyl, alkynyl, cycloalkyl, heterocyclic, aryl, heteroaryl, aralkyl or heteroaralkyl group, wherein $R^4$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^4$ together represent the necessary atoms to form a cyclic structure.

25. The lithographic printing plate precursor according to claim 2 wherein the —N═N-Q group comprises the following formula

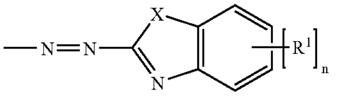

wherein n is 0, 1, 2, 3 or 4, wherein each $R^1$ is selected from hydrogen, an optionally substituted alkyl, alkenyl, alkynyl, cycloalkyl, heterocyclic, aryl, heteroaryl, aralkyl or heteroaralkyl group, —$SO_2$—NH—$R^2$, —NH—$SO_2$—$R^4$, —CO—$NR^2$—$R^3$, —$NR^2$—CO—$R^4$, —O—CO—$R^4$, —CO—O—$R^2$, —CO—$R^2$, —$SO_3$—$R^2$, —$SO_2$—$R^2$, —SO—$R^4$, —P(═O)(—O—$R^2$)(—O—$R^3$), —$NR^2$—$R^3$, —O—$R^2$, —S—$R^2$, —CN, —$NO_2$, a halogen and -M-$R^2$, wherein M represents a divalent linking group containing 1 to 8 carbon atoms, wherein X is O, S or $NR^5$, wherein $R^2$, $R^3$ and $R^5$ are independently selected from hydrogen or an optionally substituted alkyl, alkenyl, alkynyl, cycloalkyl, heterocyclic, aryl, heteroaryl, aralkyl or heteroaralkyl group, wherein $R^4$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^5$ together represent the necessary atoms to form a cyclic structure.

26. The lithographic printing plate precursor according to claim 3 wherein the —N═N-Q group comprises the following formula

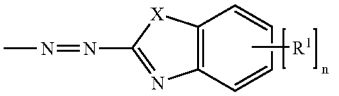

wherein n is 0, 1, 2, 3 or 4, wherein each $R^1$ is selected from hydrogen, an optionally substituted alkyl, alkenyl, alkynyl, cycloalkyl, heterocyclic, aryl, heteroaryl, aralkyl or heteroaralkyl group, —$SO_2$—NH—$R^2$, —NH—$SO_2$—$R^4$, —CO—$NR^2$—$R^3$, —$NR^2$—CO—$R^4$, —O—CO—$R^4$, —CO—O—$R^2$, —CO—$R^2$, —$SO_3$—$R^2$, —$SO_2$—$R^2$, —SO—$R^4$, —P(═O)(—O—$R^2$)(—O—$R^3$), —$NR^2$—$R^3$, —O—$R^2$, —S—$R^2$, —CN, —$NO_2$, a halogen and -M-$R^2$, wherein M represents a divalent linking group containing 1 to 8 carbon atoms, wherein X is O, S or $NR^5$, wherein $R^2$, $R^3$ and $R^5$ are independently selected from hydrogen and an optionally substituted alkyl, alkenyl, alkynyl, cycloalkyl, heterocyclic, aryl, heteroaryl, aralkyl or heteroaralkyl group, wherein $R^4$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^5$ together represent the necessary atoms to form a cyclic structure.

27. The lithographic printing plate precursor according to claim 2 wherein the —N═N-Q group comprises the following formula

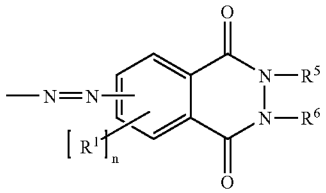

wherein n is 0, 1, 2 or 3, wherein each $R^1$ is selected from hydrogen, an optionally substituted alkyl, alkenyl, alkynyl, cycloalkyl, heterocyclic, aryl, heteroaryl, aralkyl or heteroaralkyl group, —$SO_2$—NH—$R^2$, —NH—$SO_2$—$R^4$, —CO—$NR^2$—$R^3$, —$NR^2$—CO—$R^4$, —O—CO—$R^4$, —CO—O—$R^2$, —CO—$R^2$, —$SO_3$—$R^2$, —$SO_2$—$R^2$, —SO—$R^4$, —P(═O)(—O—$R^2$)(—O—$R^3$), —$NR^2$—$R^3$, —O—$R^2$, —S—$R^2$, —CN, —$NO_2$, a halogen and -M-$R^2$, wherein M represents a divalent linking group containing 1 to 8 carbon atoms, wherein $R^2$, $R^3$, $R^5$ and $R^6$ are independently selected from hydrogen and an optionally substituted alkyl, alkenyl, alkynyl, cycloalkyl, heterocyclic, aryl, heteroaryl, aralkyl or heteroaralkyl group, wherein $R^4$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^4$ together represent the necessary atoms to form a cyclic structure, or wherein $R^5$ and $R^6$ together represent the necessary atoms to form a cyclic structure.

28. The lithographic printing plate precursor according to claim 3 wherein the —N═N-Q group comprises the following formula

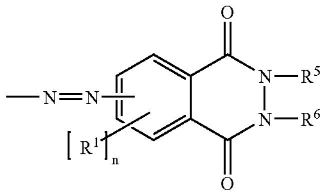

wherein n is 0, 1, 2 or 3, wherein each $R^1$ is selected from hydrogen, an optionally substituted alkyl, alkenyl, alkynyl, cycloalkyl, heterocyclic, aryl, heteroaryl, aralkyl or heteroaralkyl group, —$SO_2$—NH—$R^2$, —NH—$SO_2$—$R^4$, —CO—$NR^2$—$R^3$, —$NR^2$—CO—$R^4$, —O—CO—$R^4$, —CO—O—$R^2$, —CO—$R^2$, —$SO_3$—$R^2$, —$SO_2$—$R^2$, —SO—$R^4$, —P(═O)(—O—$R^2$)(—O—$R^3$), —$NR^2$—$R^3$, —O—$R^2$, —S—$R^2$, —CN, —$NO_2$, a halogen and -M-$R^2$, wherein M represents a divalent linking group containing 1 to 8 carbon atoms, wherein $R^2$, $R^3$, $R^5$ and $R^6$ are independently selected from hydrogen and an optionally substituted alkyl, alkenyl, alkynyl, cycloalkyl, heterocyclic, aryl, heteroaryl, aralkyl or heteroaralkyl group, wherein $R^4$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^4$ together represent the necessary atoms to form a cyclic structure, or wherein $R^5$ and $R^6$ together represent the necessary atoms to form a cyclic structure.

29. The lithographic printing plate precursor according to claim 2 wherein the —N═N-Q group comprises the following formula

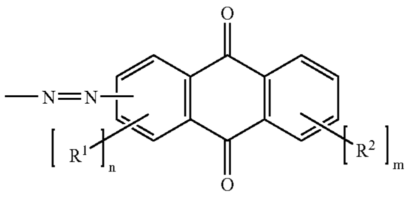

wherein n is 0, 1, 2 or 3, wherein m is 0, 1, 2, 3 or 4, wherein each $R^1$ and $R^2$ are independently selected from hydrogen, an optionally substituted alkyl, alkenyl, alkynyl, cycloalkyl, heterocyclic, aryl, heteroaryl, aralkyl or heteroaralkyl group, —$SO_2$—NH—$R^3$, —NH—$SO_2$—$R^5$, —CO—$NR^3$—$R^4$, —$NR^3$—CO—$R^5$, —O—CO—$R^5$, —CO—O—$R^3$, —CO—$R^3$, —$SO_3$—$R^3$, —$SO_2$—$R^3$, —SO—$R^5$, —P(═O)(—O—$R^3$)(—O—$R^4$), —$NR^3$—$R^4$, —O—$R^3$, —S—$R^3$, —CN, —$NO_2$, a halogen and -M-$R^3$, wherein M represents a divalent linking group containing 1 to 8 carbon atoms, wherein $R^3$ and $R^4$ are independently selected from hydrogen and an optionally substituted alkyl, alkenyl, alkynyl, cycloalkyl, heterocyclic, aryl, heteroaryl, aralkyl or heteroaralkyl group, wherein $R^5$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^5$ together represent the necessary atoms to form a cyclic structure.

30. The lithographic printing plate precursor according to claim 3 wherein the —N═N-Q group comprises the following formula

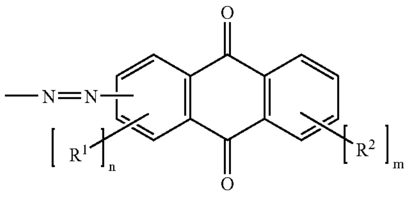

wherein n is 0, 1, 2 or 3, wherein m is 0, 1, 2, 3 or 4, wherein each $R^1$ and $R^2$ are independently selected from hydrogen, an optionally substituted alkyl, alkenyl, alkynyl, cycloalkyl, heterocyclic, aryl, heteroaryl, aralkyl or heteroaralkyl group, —$SO_2$—NH—$R^3$, —NH—$SO_2$—$R^5$, —CO—$NR^3$—$R^4$, —$NR^3$—CO—$R^5$, —O—CO—$R^5$, —CO—O—$R^3$, —CO—$R^3$, —$SO_3$—$R^3$, —$SO_2$—$R^3$, —SO—$R^5$, —P(═O)(—O—$R^3$)(—O—$R^4$), —$NR^3$—$R^4$, —O—$R^3$, —S—$R^3$, —CN, —$NO_2$, a halogen and -M-$R^3$, wherein M represents a divalent linking group containing 1 to 8 carbon atoms, wherein $R^3$ and $R^4$ are independently selected from hydrogen or an optionally substituted alkyl, alkenyl, alkynyl, cycloalkyl, heterocyclic, aryl, heteroaryl, aralkyl or heteroaralkyl group, wherein $R^5$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^5$ together represent the necessary atoms to form a cyclic structure.

31. The lithographic printing plate precursor according to claim 2 wherein the —N═N-Q group comprises the following formula

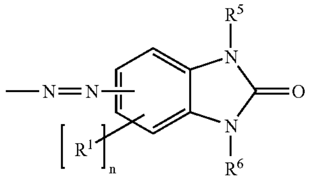

wherein n is 0, 1, 2 or 3, wherein each $R^1$ is selected from hydrogen, an optionally substituted alkyl, alkenyl, alkynyl, cycloalkyl, heterocyclic, aryl, heteroaryl, aralkyl or heteroaralkyl group, —$SO_2$—NH—$R^2$, —NH—$SO_2$—$R^4$, —CO—$NR^2$—$R^3$, —$NR^2$—CO—$R^4$, —O—CO—$R^4$, —CO—O—$R^2$, —CO—$R^2$, —$SO_3$—$R^2$, —$SO_2$—$R^2$, —SO—$R^4$, —P(═O)(—O—$R^2$)(—O—$R^3$), —$NR^2$—$R^3$, —O—$R^2$, —S—$R^2$, —CN, —$NO_2$, a halogen and -M-$R^2$, wherein M represents a divalent linking group containing 1 to 8 carbon atoms, wherein $R^2$, $R^3$, $R^5$ and $R^6$ are independently selected from hydrogen and an optionally substituted alkyl, alkenyl, alkynyl, cycloalkyl, heterocyclic, aryl, heteroaryl, aralkyl or heteroaralkyl group, wherein $R^4$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^6$ together represent the necessary atoms to form a cyclic structure.

32. The lithographic printing plate precursor according to claim 3 wherein the —N═N-Q group comprises the following formula

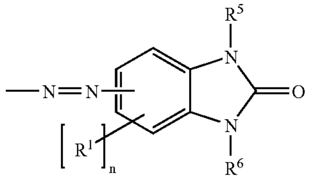

wherein n is 0, 1, 2 or 3, wherein each $R^1$ is selected from hydrogen, an optionally substituted alkyl, alkenyl, alkynyl, cycloalkyl, heterocyclic, aryl, heteroaryl, aralkyl or heteroaralkyl group, —$SO_2$—NH—$R^2$, —NH—$SO_2$—$R^4$, —CO—$NR^2$—$R^4$, —$NR^2$—CO—$R^4$, —O—CO—$R^4$, —CO—O—$R^2$, —CO—$R^2$, —$SO_3$—$R^2$, —$SO_2$—$R^2$, —SO—$R^4$, —P(═O)(—O—$R^2$)(—O—$R^3$), —$NR^2$—$R^3$, —O—$R^2$, —S—$R^2$, —CN, —$NO_2$, a halogen and -M-$R^2$, wherein M represents a divalent linking group containing 1 to 8 carbon atoms, wherein $R^2$, $R^3$, $R^5$ and $R^6$ are independently selected from hydrogen and an optionally substituted alkyl, alkenyl, alkynyl, cycloalkyl, heterocyclic, aryl, heteroaryl, aralkyl or heteroaralkyl group, wherein $R^4$ is selected from an optionally substituted alkyl, alkenyl, alkynyl, cycloalkyl, heterocyclic, aryl, heteroaryl, aralkyl or heteroaralkyl group, or wherein at least two groups selected from each $R^1$ to $R^6$ together represent the necessary atoms to form a cyclic structure.

33. The lithographic printing plate precursor according to claim 2 wherein the —N═N-Q group comprises one of the following formulae:

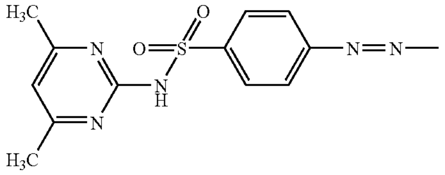

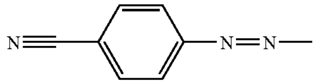

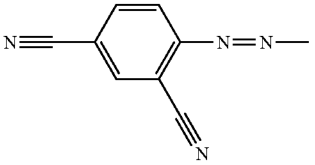

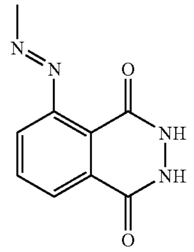

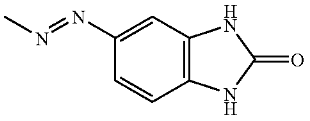

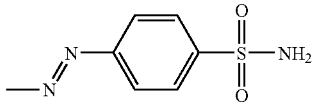

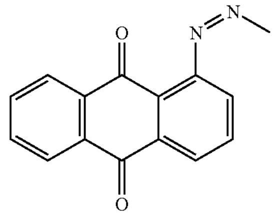

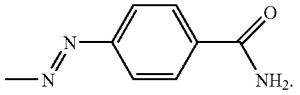

34. The lithographic printing plate precursor according to claim 3 wherein the —N═N-Q group comprises one of the following formulae:

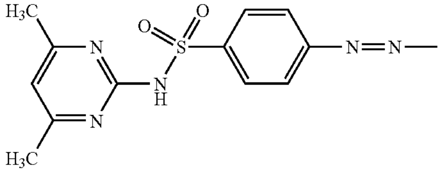

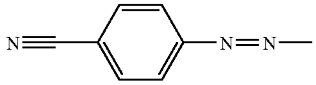

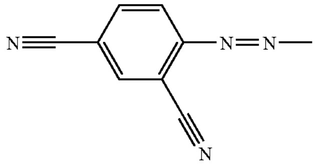

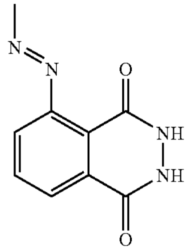

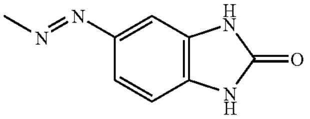

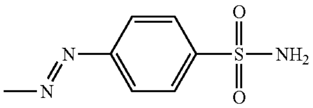

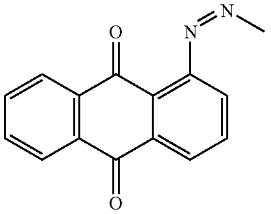

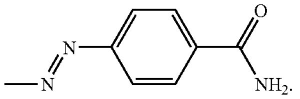

35. The lithographic printing plate precursor according to claim 2, wherein said coating further comprises a dissolution inhibitor and wherein said precursor is a positive working lithographic printing plate precursor.

36. The lithographic printing plate precursor according to claim 3, wherein said coating further comprises a dissolution inhibitor and wherein said precursor is a positive working lithographic printing plate precursor.

37. The lithographic printing plate precursor according to claim 4, wherein said coating further comprises a dissolution inhibitor and wherein said precursor is a positive working lithographic printing plate precursor.

38. The lithographic printing plate precursor as amended in claim 5, wherein said coating further comprises a dissolution inhibitor and wherein said precursor is a positive working lithographic printing plate precursor.

39. The lithographic printing plate precursor according to claim 6, wherein said coating further comprises a dissolution inhibitor and wherein said precursor is a positive working lithographic printing plate precursor.

40. The lithographic printing plate precursor according to claim 7, wherein said coating further comprises a dissolution inhibitor and wherein said precursor is a positive working lithographic printing plate precursor.

41. The lithographic printing plate precursor according to claim 8, wherein said coating further comprises a dissolution inhibitor and wherein said precursor is a positive working lithographic printing plate precursor.

42. The lithographic printing plate precursor according to claim 9, wherein said coating further comprises a dissolution inhibitor and wherein said precursor is a positive working lithographic printing plate precursor.

43. The lithographic printing plate precursor according to claim 10, wherein said coating further comprises a dissolution inhibitor and wherein said precursor is a positive working lithographic printing plate precursor.

44. The lithographic printing plate precursor according to claim 11, wherein said coating further comprises a dissolution inhibitor and wherein said precursor is a positive working lithographic printing plate precursor.

45. The lithographic printing plate precursor according to claim 12, wherein said coating further comprises a dissolution inhibitor and wherein said precursor is a positive working lithographic printing plate precursor.

46. The lithographic printing plate precursor according to claim 2, wherein said coating further comprising a latent Brönsted acid and an acid-crosslinkable compound and wherein said precursor is a negative working lithographic printing plate precursor.

47. The lithographic printing plate precursor according to claim 3, wherein said coating further comprising a latent Brönsted acid and an acid-crosslinkable compound and wherein said precursor is a negative working lithographic printing plate precursor.

48. The lithographic printing plate precursor according to claim 4, wherein said coating further comprising a latent Brönsted acid and an acid-crosslinkable compound and wherein said precursor is a negative working lithographic printing plate precursor.

49. The lithographic printing plate precursor according to claim 5, wherein said coating further comprising a latent Brönsted acid and an acid-crosslinkable compound and wherein said precursor is a negative working lithographic printing plate precursor.

50. The lithographic printing plate precursor according to claim 6, wherein said coating further comprising a latent Brönsted acid and an acid-crosslinkable compound and wherein said precursor is a negative working lithographic printing plate precursor.

51. The lithographic printing plate precursor according to claim 7, wherein said coating further comprising a latent Brönsted acid and an acid-crosslinkable compound and wherein said precursor is a negative working lithographic printing plate precursor.

52. The lithographic printing plate precursor according to claim 8, wherein said coating further comprising a latent Brönsted acid and an acid-crosslinkable compound and wherein said precursor is a negative working lithographic printing plate precursor.

53. The lithographic printing plate precursor according to claim 9, wherein said coating further comprising a latent Brönsted acid and an acid-crosslinkable compound and wherein said precursor is a negative working lithographic printing plate precursor.

54. The lithographic printing plate precursor according to claim 10, wherein said coating further comprising a latent Brönsted acid and an acid-crosslinkable compound and wherein said precursor is a negative working lithographic printing plate precursor.

55. The lithographic printing plate precursor according to claim 11, wherein said coating further comprising a latent Brönsted acid and an acid-crosslinkable compound and wherein said precursor is a negative working lithographic printing plate precursor.

56. The lithographic printing plate precursor according to claim 12, wherein said coating further comprising a latent Brönsted acid and an acid-crosslinkable compound and wherein said precursor is a negative working lithographic printing plate precursor.

57. A method for increasing the chemical resistance of a coating of a positive working heat-sensitive lithographic printing plate precursor, the method comprising providing a coating comprising:

a polymer which comprises a phenolic monomeric unit wherein the phenyl group of the phenolic monomeric unit is substituted by a group having the structure —N═N-Q wherein the —N═N— group is covalently bound to a carbon atom of the phenyl group and wherein Q is an aromatic group, an infrared absorbing agent, and a dissolution inhibitor.

58. A method for increasing the chemical resistance of a coating of a negative working heat-sensitive lithographic printing plate, the method comprising providing a coating comprising:

a polymer which comprises a phenolic monomeric unit wherein the phenyl group of the phenolic monomeric unit is substituted by a group having the structure —N═N-Q wherein the —N═N— group is covalently bound is a carbon atom of the phenyl group and wherein Q is an aromatic group, a latent Brönsted acid, and an acid-crosslinkable compound.

* * * * *